(12) United States Patent
LaBosco et al.

(10) Patent No.: US 12,745,364 B2
(45) **Date of Patent: *Sep. 22, 2026**

(54) DUAL MODE COOLING SYSTEM FOR USE WITH IN-WALL VIDEO-CODEC AND OTHER ELECTRONIC CIRCUITS

(71) Applicant: Crestron Electronics, Inc., Rockleigh, NJ (US)

(72) Inventors: Mark LaBosco, New City, NY (US); Sanjay Upasani, Manalapan, NJ (US); Edward Joy, Carmel, NY (US); Dario Pagano, Rockleigh, NJ (US); Alec Magrini, Emerson, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 202 days.

This patent is subject to a terminal disclaimer.

(21) Appl. No.: 18/812,755

(22) Filed: Aug. 22, 2024

(65) Prior Publication Data

US 2024/0414875 A1 Dec. 12, 2024

Related U.S. Application Data

(63) Continuation of application No. 17/858,527, filed on Jul. 6, 2022, now Pat. No. 12,075,595.

(51) Int. Cl.
*H05K 7/20* (2006.01)
*G06F 1/20* (2006.01)

(52) U.S. Cl.
CPC ......... *H05K 7/20154* (2013.01); *G06F 1/206* (2013.01); *H05K 7/20127* (2013.01);
(Continued)

(58) Field of Classification Search
CPC ..... H01L 23/467; H01L 23/3672; G06F 1/20; G06F 2200/201; G06F 1/181; G06F 1/183; G06F 1/16; H05K 7/20145; H05K 7/20154; H05K 7/20918; H05K 7/20127; H05K 7/20172; H05K 1/0203; H05K 5/0214; H05K 7/1427; H05K 7/20518; H05K 1/0204; H05K 7/20963; F28D 2021/0029
See application file for complete search history.

(56) References Cited

U.S. PATENT DOCUMENTS 6,795,315 B1 * 9/2004 Wu ..................... H05K 7/1461 174/16.3
7,035,126 B1 * 4/2006 Lanni .................. H01R 31/065 439/518

(Continued)

OTHER PUBLICATIONS

2024_05_31_CP00565_03_NPL_IDS_cpdf.

*Primary Examiner* — Mandeep S Buttar
(74) *Attorney, Agent, or Firm* — Mark W. Hrozenchik

(57) ABSTRACT

Described herein is a compact combined active and passive cooling system to cool electronic audio-video circuitry, wherein all of the AV circuitry and cooling system fits within an enclosure that can be installed in a standard wall gang-box located in interior walls of structures. The combined active and passive cooling system uses convection, conduction, and radiation in active and passive cooling modes to dissipate heat generated by the AV circuitry into the room in which the gang box is located, and further uses the wall plate surface to dissipate heat into the room.

20 Claims, 16 Drawing Sheets

(52) U.S. Cl.
CPC ..... *H05K 7/20145* (2013.01); *H05K 7/20418* (2013.01); *H05K 7/205* (2013.01)

(56) References Cited

U.S. PATENT DOCUMENTS

| | | | | |
|---|---|---|---|---|
| 9,941,604 | B2 * | 4/2018 | Mortun | H05K 5/0286 |
| 2017/0187155 | A1 * | 6/2017 | Jansen | H05K 5/0286 |
| 2017/0290195 | A1 * | 10/2017 | Jansen | H01R 24/76 |
| 2019/0189147 | A1 * | 6/2019 | Monteith | H04R 1/025 |

* cited by examiner 500
516
516
510b
512
524
402
302
102
402
404
510a
514
518
122
602d
404
520
404
604
608
602c
508
604
604
604
608
606
604
504
604
502
610
602b
604
404
518
604
608
604
506
404
604
608
602a
304
526
404
404
404

900
206
116
102
402
302
402
402
522
402
512
514
516
404
510b
510a
404
122
518
524
404
902
520a
904
404
508
506
502
404
404
304
520b
A
A
404
404
404

900
516
510b
512
524
516
510a
402
302
102
402
404
520
514
602d
604
506
508
518
604
604
604
602c
604
502
520a
520b
122
404
404
602b
604
604
604
604
604
602a
304
404
404

206
116
102
1300
518
510b
508
404
404
404
404
516
402
304
404
504
404
122
512
402
404
506
502
520
404
514
302
510a
402
402

DUAL MODE COOLING SYSTEM FOR USE WITH IN-WALL VIDEO-CODEC AND OTHER ELECTRONIC CIRCUITS

PRIORITY INFORMATION

The present application claims priority under 35 U.S.C. § 120 as a continuation application to U.S. Non-Provisional patent application Ser. No. 17/858,527, filed Jul. 6, 2002, and which will issue on Aug. 27, 2024, as U.S. Pat. No. 12,075,595, the entire contents of which are expressly incorporated herein by reference.

CROSS REFERENCE TO RELATED APPLICATIONS

Related subject matter is disclosed in U.S. Non-provisional patent application Ser. No. 17/858,462, filed on Jul. 6, 2022, and in U.S. Non-provisional patent application Ser. No. 17/858,616, filed on Jul. 6, 2022, the entire contents of both of which are expressly incorporated herein by reference.

BACKGROUND

Technical Field

Aspects of the embodiments described herein relate generally to cooling systems, and more specifically to systems, methods, and modes for a dual mode cooling system for electronics with limited access to cooling surfaces or ducts.

Background Art

The use of heat generating electronics confined to smaller and smaller compartments has grown substantially over the last several decades, as microprocessors and integrated circuits have increased in computing power and speed, and shrunk in size. Such size shrinkage means that more devices can be fit into a specific volume, with proportional and sometimes exponential increases in heat dissipation requirements. One such category of electronic devices that have achieved substantial increases of capabilities and heat generation are audio/video (AV) transmitter/receiver (transceiver) devices.

Such AV transceivers can be used in many different locations in an office or home, but one particularly demanding environment are those that are housed in gang boxes with faceplates that are secured within the walls of a house/building. Such AV transceivers gang boxes and faceplates have been commonly used for many years. They started with analog feedthrough connectors mounted on a faceplate that mounts to a standard gang-box installed in a wall. Coax cable was run through the wall and terminated to the plate. Users could then plug in their laptop or TV to these plates. As AV went digital it became difficult to transport the digital signals over long distances so circuits were created to convert the AV signals to a new format that can work over long in-wall cables. These circuits had to be located inside the wall gang boxes. Wall gang boxes can be surrounded by the wall insulation trapping heat. The only reliable path to remove heat is through the front wall faceplate. FIG. 1 illustrates a typical AV installation in room 100, and FIG. 2 is a sectional side view of a standard gang box (gang box) 104 and audio video circuitry housing (AVCH) 206 in internal wall 116.

Faceplate 102 covers gang box 104 and AVCH 206 that is located within internal wall 116. Internal AV cable 106 carries the AV signal to AV circuitry 118 that is housed within AVCH 206 located within gang box 104, both of which, as those of skill in the art can appreciate, are substantially enclosed, and thus cannot dissipate excess heat into wall cavity 204 (FIG. 2) between walls 116 and 202. That is, AVCH 206 and gang box 104 is substantially adiabatic. External AV cable 108 carries the processed AV signal from AV circuitry 118 to AV receiver/modem/amplifier (AV device) 110, which then outputs the same or the further processed AV signal to AV display 112. AV device 110 can be located on or in bureau 114, which is located in interior area 122.

Faceplates 102 have a limited surface area to transfer the heat outside internal wall 116. This is made worse by installing a common plastic "Decora" faceplate 102 that covers much of the metal mounting plate. As video is being transported over cables 106, 108, the power consumption of the integrated circuit (IC) devices used to convert the baseband AV signals to a format compatible with these cables can exceed what can be dissipated by faceplate 102. The convertor ICs (AV circuitry 118) can be a dedicated conversion application specific IC (ASIC), field programmable gate array (FPGA), and/or a central processing unit (CPU) system on a chip (SoC). In addition, AV circuitry 118 can further comprise memory (e.g., but not limited to dynamic random access memory (DRAM) and Flash memory alongside the IC that may also be a heat source and requires cooling.

Even if AV circuitry 118 could be cooled by conduction to the faceplate 102, it is important to not allow the exposed surfaces to get too hot to touch. Safety requirements such as UL/IEC 62368 define allowed touch temperatures on product surfaces.

Accordingly, a need has arisen for systems, methods, and modes for a dual mode cooling system for electronics with limited access to cooling surfaces or ducts.

SUMMARY

It is an object of the embodiments to substantially solve at least the problems and/or disadvantages discussed above, and to provide at least one or more of the advantages described below.

It is therefore a general aspect of the embodiments to provide systems, methods, and modes for a dual mode cooling system for electronics with limited access to cooling surfaces or ducts that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, a dual mode cooling system is provided, comprising: electronic heat generating circuitry; a printed circuit board upon which the electronic heat generating circuitry is located on a first side; a substantially adiabatic enclosure adapted to house the electronic heat generating circuitry, printed circuit board and other components of the dual mode cooling system; a finned heat sink adapted to be in thermal contact with the electronic heat generating circuitry, the finned heat sink comprising a plurality of heat radiating fins, each of the plurality of heat radiating fins comprising a plurality of heated surfaces; a faceplate adapted to enclose the substantially adiabatic enclosure and seal the substantially adiabatic enclosure against an interior wall, and wherein the faceplate comprises: a cool air intake port adapted to receive cool air from an area external to the substantially adiabatic enclosure and provide the cool air to an interior portion of the substantially adiabatic enclosure, and a heated air exhaust port adapted to exhaust heated air out of the substantially adiabatic enclosure into an area external to the substantially adiabatic enclosure; a fan adapted to receive cool air from the cool air intake port and blow the cool air through the plurality of heat radiating fins of the finned heat sink to remove substantially all of the heat generated by the electronic heat generating circuitry via convection and generate heated air, and wherein the heated air is exhausted through the heated air exhaust port by the fan, and wherein an active cooling path comprises a path of air as it is received from the cool air intake port, passes through the fan, over each of the plurality of heated surfaces, and then is exhausted from the heated air exhaust port, and further wherein, the heated air exhaust port comprises—one or more holes in the faceplate formed at a first acute angle β with respect to an imaginary line perpendicular to a surface of the faceplate such that the heated air is expelled away from the faceplate in a first direction, and the cool air intake port comprises—one or more holes in the faceplate formed at a second acute angle α with respect to an imaginary line perpendicular to the surface of the faceplate such that the cool air is ingested into the substantially adiabatic enclosure from a second direction, and wherein the first and second acute angles are in opposition to each other, and further wherein the heated air exhaust port is separated with respect to the cool air intake port; and first passive cooling path comprising: the electronic heat generating circuitry; the printed circuit board upon which the electronic heat generating circuitry is located; one or more through hole thermal vias located in the printed circuit board that are each adapted to be in thermal contact with the electronic heat generating circuitry and to accept heat generated by the electronic heat generating circuitry and transfer the heat generated by the electronic heat generating circuitry; a first heat conducting device adapted to be in thermal contact with the one or more through hole thermal vias, and which is adapted to transfer heat via conduction from the one or more through hole thermal vias, and which is further adapted to be a compressible gap pad to form a thermal transfer path between two objects; a second heat conducting device adapted to be in thermal contact with the first heat conducting device and to accept heat conducted by the first heat conducting device; and a third heat conducting device adopted to be in thermal contact with the second heat conducting device and to accept heat conducted from the first heat conducting device and is further adapted to be compressible to form a thermal transfer path between two objects, and wherein the face plate is adapted to be in thermal contact with the third heat conducting device and to accept heat conducted from the second heat conducting device, and is further adapted to convectively transfer received heat from its surface to air surrounding the face plate.

According to the first aspect of the embodiments, the dual mode cooling system further comprises: a second passive cooling path comprising: the electronic heat generating circuitry; and the finned heat sink located on the electronic heat generating circuitry, and which is adapted to be in thermal contact with the electronic heat generating circuitry and to accept heat conducted from the electronic heat generating circuitry.

According to the first aspect of the embodiments, the heated air exhaust port is cater cornered with respect to the cool air intake port.

According to the first aspect of the embodiments, the combination of the passive cooling paths is adapted to transfer heat to and through the faceplate such that following the electronic heat generating circuitry being put into an inactive state and the fan being shut off, the combination of the passive cooling paths convectively transfers heat away from the interior of the substantially adiabatic enclosure through the faceplate such that the faceplate remains at a temperature below an unsafe temperature.

According to the first aspect of the embodiments, the convective transfer of heat away from the faceplate and interior of the substantially adiabatic enclosure is such that the faceplate remains at a temperature below an unsafe temperature occurs through the conductive transfer of heat to a first area of the faceplate.

According to the first aspect of the embodiments, the unsafe temperature is about 70° C.

According to the first aspect of the embodiments, the dual mode cooling system further comprises a baffle wall that separates an interior of the substantially adiabatic enclosure into a cool air baffle zone and a heated air baffle zone, such that substantially only cool air is located in the cool air baffle zone and substantially only heated air is located in the heated air baffle zone.

According to the first aspect of the embodiments, the dual mode cooling system further comprises: at least one or more holes in the printed circuit board that allow cool air to flow from one side of the printed circuit board to the other side of the printed circuit board in the cool air baffle zone; and at least one or more holes in the printed circuit board that allow heated air to flow from one side of the printed circuit board to the other side of the printed circuit board in the heated air baffle zone.

According to the first aspect of the embodiments, the faceplate comprises: at least one audio video signal connector.

According to the first aspect of the embodiments, the electronic heat generating circuitry comprises: audio-video processing circuitry.

According to the first aspect of the embodiments, the substantially adiabatic enclosure comprises: a standard gang box.

According to the first aspect of the embodiments, the standard gang box can be located within an insulated wall.

According to the first aspect of the embodiments, the dual mode cooling system, further comprises: one or more through hole thermal vias located in the printed circuit board that are each adapted to be in thermal contact with the electronic heat generating circuitry and to accept heat generated by the electronic heat generating circuitry and to transfer the same to the finned heat sink, the finned heat sink located on a second side of the printed circuit board.

According to the first aspect of the embodiments, the cool air intake port comprises—one or more holes in the faceplate formed at an angle α with respect to a first imaginary line that is formed perpendicular to an outer surface of the faceplate, such that the cool air is ingested into the substantially adiabatic enclosure from a first direction, and wherein the heated air exhaust portal comprises—one or more holes in the faceplate formed at an angle β with respect to a second imaginary line that is formed perpendicular to the outer surface of the faceplate such that the heated exhaust air is expelled away from the faceplate in a second direction.

According to the first aspect of the embodiments, the angle α and the angle β are each about 0°.

According to the first aspect of the embodiments, the angle α is an acute angle and the angle β is about 0°.

According to the first aspect of the embodiments, the cool air intake port formed at the angle α points away from the heated air exhaust port formed at the angle β.

According to the first aspect of the embodiments, the angle α is about 0° and the angle β is an acute angle.

According to the first aspect of the embodiments, the angle α is an acute angle and the angle β is an acute angle.

According to a second aspect of the embodiments, an audio-video distribution system is provided, comprising: an audio-video encoder adapted to receive at least one high definition multimedia interface (HDMI) encoded audio-video (AV) signal via an HDMI cable, encode the same as an AV-over-internet protocol (AV-over-IP) signal, transmit the AV-over-IP signal to an AV receiver/splitter, wherein the AV receiver/splitter is adapted to receive the AV-over-IP signal, split the audio portion from the video portion of the AV-over-IP signal, convert the video portion back to an HDMI encoded video signal, re-transmit the HDMI encoded video signal to a display that is adapted to display an HDMI encoded video signal, and re-transmit the audio portion to one or more loudspeakers, and wherein the audio-video encoder comprises—electronic heat generating circuitry; a printed circuit board upon which the electronic heat generating circuitry is located on a first side; a substantially adiabatic enclosure adapted to house the electronic heat generating circuitry, printed circuit board and other components of the dual mode cooling system; a finned heat sink adapted to be in thermal contact with the electronic heat generating circuitry, the finned heat sink comprising a plurality of heat radiating fins, each of the plurality of heat radiating fins comprising a plurality of heated surfaces; a faceplate adapted to enclose the substantially adiabatic enclosure and seal the substantially adiabatic enclosure against an interior wall, and wherein the faceplate comprises—a cool air intake port adapted to receive cool air from an area external to the substantially adiabatic enclosure and provide the cool air to an interior portion of the substantially adiabatic enclosure, and a heated air exhaust port adapted to exhaust heated air out of the substantially adiabatic enclosure into an area external to the substantially adiabatic enclosure; a fan adapted to receive cool air from the cool air intake port and blow the cool air through the plurality of heat radiating fins of the finned heat sink to remove substantially all of the heat generated by the electronic heat generating circuitry via convection and generate heated air, and wherein the heated air is exhausted through the heated air exhaust portal by the fan, and wherein an active cooling path comprises a path of air as it is received from the cool air intake port, passes through the fan, over each of the plurality of heated surfaces, and then is exhausted from the heated air exhaust port, and further wherein, the heated air exhaust port comprises—one or more holes in the faceplate formed at a first acute angle β with respect to an imaginary line perpendicular to a surface of the faceplate such that the heated air is expelled away from the faceplate in a first direction, and the cool air intake port comprises—one or more holes in the faceplate formed at a second acute angle α with respect to an imaginary line perpendicular to the surface of the faceplate such that the cool air is ingested into the substantially adiabatic enclosure from a second direction, and wherein the first and second acute angles are in opposition to each other, and further wherein the heated air exhaust port is separated with respect to the cool air intake port; and a first passive cooling path comprising: the electronic heat generating circuitry; the printed circuit board upon which the electronic heat generating circuitry is located; one or more through hole thermal vias located in the printed circuit board that are each adapted to be in thermal contact with the electronic heat generating circuitry and to accept heat generated by the electronic heat generating circuitry and transfer the heat generated by the electronic heat generating circuitry; a first heat conducting device adapted to be in thermal contact with the one or more through hole thermal vias, and which is adapted to transfer heat via conduction from the one or more through hole vias, and which is further adapted to be a compressible gap pad to form a thermal transfer path between two objects; a second heat conducting device adapted to be in thermal contact with the first heat conducting device and to accept heat conducted by the first heat conducting device; and a third heat conducting device adopted to be in thermal contact with the second heat conducting device and to accept heat conducted from the first heat conducting device and is further adapted to be a compressible gap pad to form a thermal transfer path between two objects, and wherein the face plate is adapted to be in thermal contact with the third heat conducting device and to accept heat conducted from the second heat conducting device, and is further adapted to transfer received heat from its surface to the surrounding air via convection and radiation.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

DETAILED DESCRIPTION

Figure 1:
FIG. 1 illustrates a conventional audio video installation in a bedroom that includes audio-video circuitry housing within a gang box installed on an interior wall.
Figure 1:
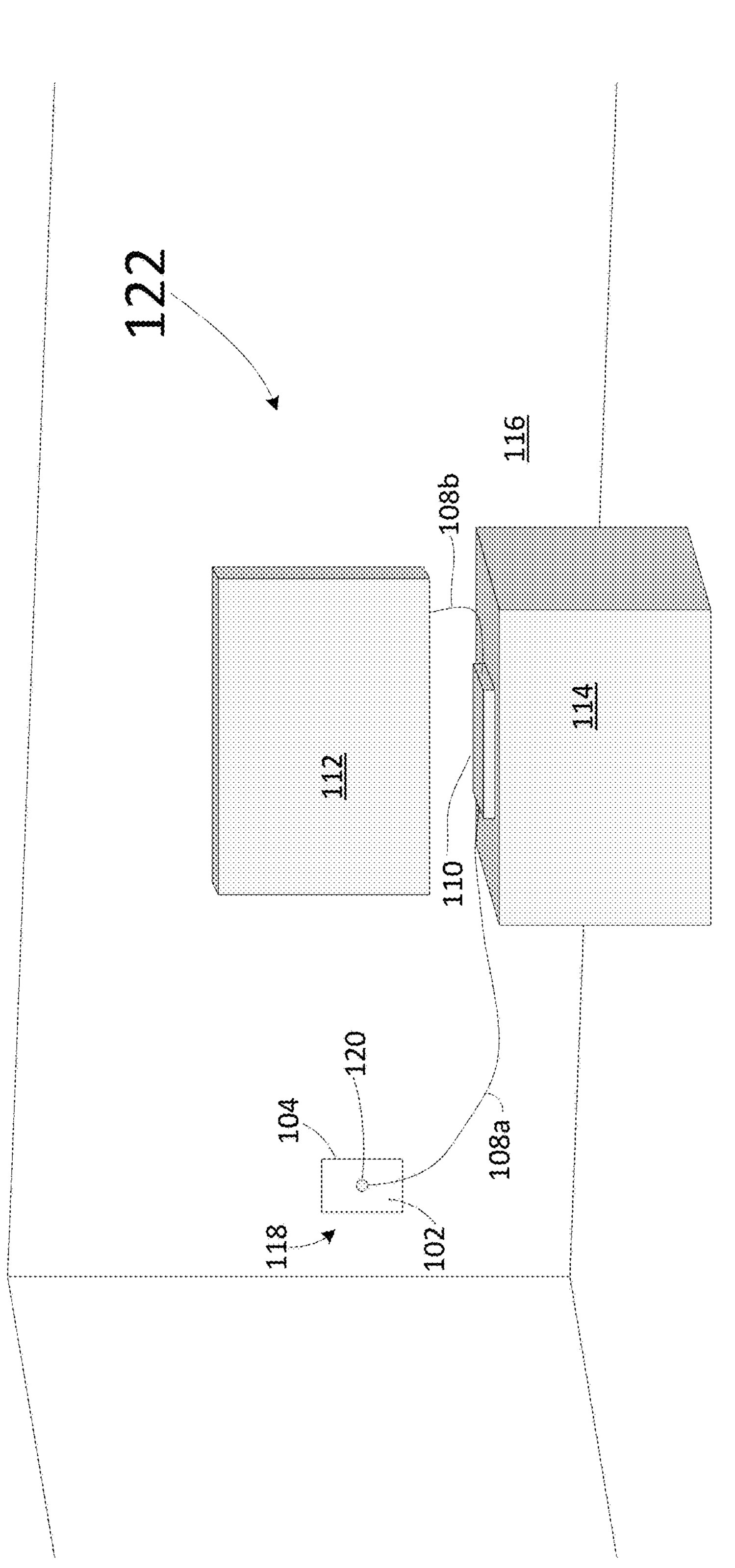

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as the cooling of electronic circuitry such as AV electronic circuitry that can be housed in within AVCH 206 that is located within gang box 104 in internal wall 116.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.

100 Audio System Installation Location (Room)
102 Faceplate
104 Standard Gang Box (Gang Box)
106 Internal Audio Video (AV) Cable (Coax, Digital (HDMI))
108 External AV Cable (Coax, Digital (HDMI))
110 AV Receiver/Modem (AV Device)
112 AV Display
114 Bureau/Desk
116 Internal Wall
118 AV Circuitry
120 External AV Connector
122 Interior Area
202 Exterior Wall
204 Wall Cavity
206 Audio Video (AV) Circuitry Housing
302 Cool Air Intake Ports
304 Heated Air Exhaust Ports
402 Cool Air
404 Heated Air (Heat transferred by Convection)
406 First Imaginary Line
408 Second Imaginary Line
500 Dual Mode Cooling Assembly
502 Heat Conducting Metal Block (HCMB)
504 Heat Pipe (HP)
506 Integrated Circuit (IC)
508 Finned Heat Sink (FHS)
510 Baffle
512 Centrifugal Fan (CF)
514 Printed Circuit Board (PCB)
516 Cool Air Baffle Zone
518 Heated Air Baffle Zone
520 Gap Pad
522 Cool Air Holes
524 Heated Air Holes
526 First Active Cooling Path
602 Through Hole Thermal Via
604 Conducted Heat (Heat transferred by Conduction)
606 First Passive Cooling Path
608 Second Passive Cooling Path
610 Third Passive Cooling Path
900 Second Dual Mode Cooling System
902 Fourth Passive Cooling Path
904 Fifth Passive Cooling Path
1100 Third Dual Mode Cooling System
1300 Fourth Dual Mode Cooling System
1600 Fifth Dual Mode Cooling System

List of Acronyms Used in the Specification in Alphabetical Order

The following is a list of the acronyms used in the specification in alphabetical order.

ASIC Application Specific Integrated Circuit
AV Audio Video
AVCH AV Circuitry Housing
CF Centrifugal Fan
CPU Central Processing Unit
DRAM Dynamic Random Access Memory
FHS Finned Heat Sink
FPGA Field Programmable Gate Array
HCMB Heat Conducting Metal Block
HDMI High Definition Multimedia Interface
HP Heat Pipe
IC Integrated Circuit
PCB Printed Circuit Board
SoC System on a Chip The different aspects of the embodiments described herein pertain to the context of a systems, methods, and modes for a dual mode cooling system for electronics with limited access to cooling surfaces or ducts, but is not limited thereto, except as may be set forth expressly in the appended claims.

Crestron Electronics Inc. is one of the world's leading manufacturer of control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein, as embodied as dual mode cooling assembly 500 can be manufactured by Crestron Electronics Inc., located in Rockleigh, NJ, and used in a device marketed and sold as and NVX wall encoder, part number DM-NVX-E20-2G, and used with DM-NVX®.

The DM-NVX-E20-2G encoder can accept (receive) high definition multimedia interface (HDMI) video and encode it into an AV-over-IP stream. In the simplest case, the video and audio is received through an HDMI connector/cable by the DM-NVX-E20-2G encoder, then transmitted over a network as AV-over-IP to a decoder that then converts it back to HDMI. The video and audio is then rendered on a display or television. In addition, the audio can be "stripped" and transmitted to separate loudspeakers. An AV switcher matrix can be implemented by having decoders subscribe to the multicast IP stream of the encoder they want to display. Accordingly, the DM-NVX-E20-2G encoder can be located within interior walls in a standard gang-box enclosure yet operate safely by dispersing heat using the systems and methods described herein aspects of the embodiments.

In view of the problems discussed above in regard to current uses of AV and other circuitry in small gang box 104 installations, a compact active cooling solution is needed that can fit in these enclosures and only use the front surface of faceplate 102 to exchange the air with the room is desired.

According to further aspects of the embodiments, dual mode cooling assembly 500 (as well as the others described herein) can work with many different types of faceplates, including by not limited to a standard Decora faceplate as faceplate 102, and should not protrude from internal wall 116 to assist heat transfer. Any required fans, heat sinks, and other heat dissipating devices must be contained within AVCH 206 located within gang box 104 located inside wall cavity 204. Wall cavity 204 can include insulation, for example, on exterior walls.

In addition to the active cooling required to remove the run-time heat, it is desirable to also have a passive cooling solution that can allow shutting off fans when the unit is in a low power state. For example, it is desirable that a wall plate video receiver located behind a television in a bedroom be substantially silent when the television is off, and the occupants are sleeping. Such low power state can include a state in which all or substantially all of the circuitry is in an inactive state. An inactive state can include a condition of electronic circuitry not actively processing AV signals or other signals that can generate heat.

According to aspects of the embodiments, an active cooling path includes the use of a fan or some other electromechanical device to move relatively cooler air across one or more heated surfaces to remove heat via convection. The heated surfaces can be the heat generating devices themselves, or can be other devices that have received heat via conduction from other devices and/or the heat generating device. According to aspects of the embodiments, a passive cooling path does not include moving air, and instead comprises one or more heat conducting and/or radiating devices that accept and move heat via conduction to one or more external surfaces wherein heat is expelled via convection and radiation to an ambient environment.

Figure 3:
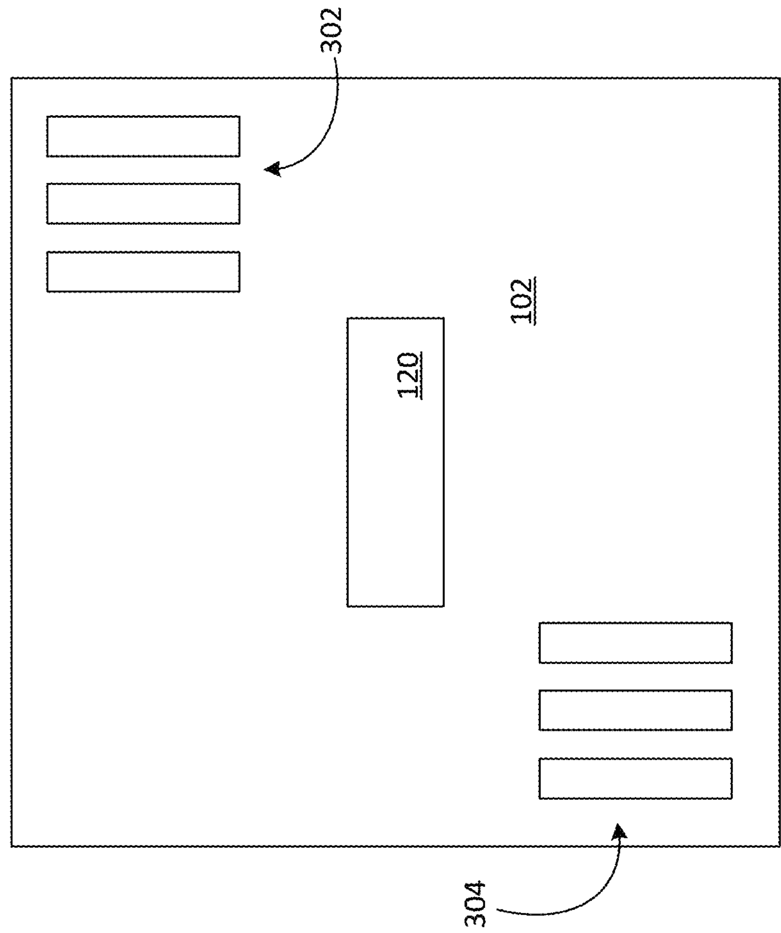
FIG. 3 illustrates a front view of a faceplate for use with a gang box that houses a dual mode cooling system for electronics that can be housed within audio video circuitry housing and used in a gang box according to aspects of the embodiments
Figure 4:
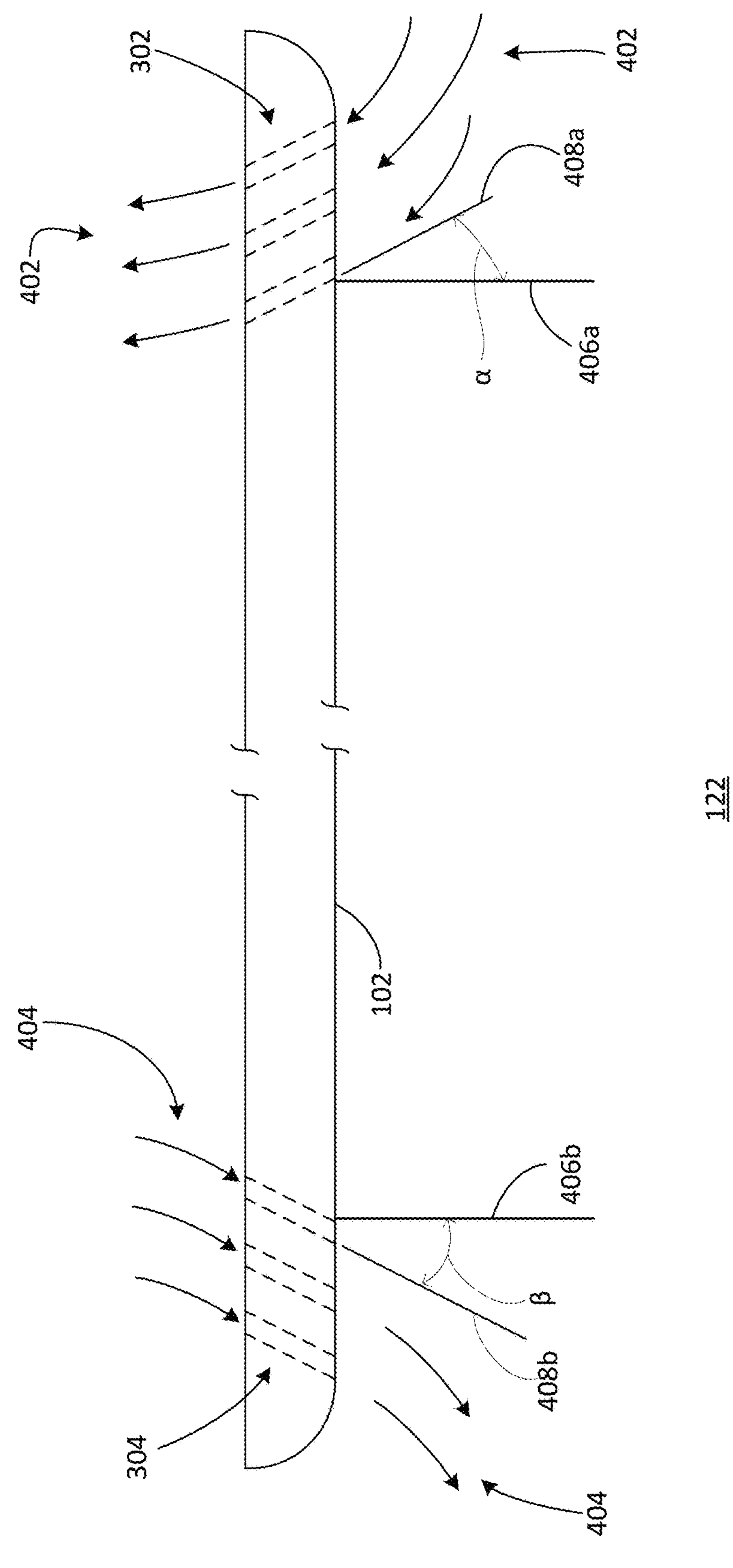
FIG. 4 illustrates a partial top view of the faceplate shown in FIG. 3 according to aspects of the embodiments.

FIG. 3 illustrates a front view of faceplate 102 for use with gang box 104 that houses dual mode cooling system 500 for electronics that can be housed within AVCH 206 and used in gang box 104 according to aspects of the embodiments, and FIG. 4 illustrates a partial top view of faceplate 102 shown in FIG. 3 according to aspects of the embodiments.

Faceplate 102 used in dual mode cooling assembly 500 can be of a standard size, though that need not necessarily be the case. Faceplate 102 as shown on in FIGS. 3 and 4 comprises external AV video connector 120, cool air intake ports 302, and heated air exhaust ports 304 according to aspects of the embodiments. As those of skill in the art can appreciate, the terms "cool," "hot," "heated," and "cooled," are all terms of degree—that is, air is "cool" in regard to other air that is hotter, or has been heated. In terms of the aspects of the embodiments, cool air 402 is ambient air that could be "cooled" by air conditioning, or non-air conditioned air. Heated air 404 is cool air 402 that has been heated by heat transferred by convection processes, well known to those of skill in the art. First imaginary lines 406*a,b* are orthogonal to outer surface of faceplate 102, and second imaginary lines 408*a,b* extend the intake and exhaust port directions, respectively, with respect to faceplate 102. First and second imaginary lines 406, 408 are included to facilitate the discussion regarding the relative angular placement of cool air intake ports 302 and heated air exhaust ports 304, in regard to each other and faceplate 102.

According to an aspect of the embodiments, cool air intake ports 302 and heated air exhaust ports 304 respectively can be angled away from each other, so that there is a reduced chance of heated air 404 that is exhausted from heated air exhaust ports 304 from being pulled into cool air intake port 302 (substantially only cool air 402 enters through cool air intake ports 302) according to aspects of the embodiments. That is, cool air intake port 302 can be formed at first angle $\alpha$, wherein first angle $\alpha$ is the angle between first imaginary line 406*a* (a line that is orthogonal or perpendicular to an outer surface of faceplate 102) and second imaginary line 408*a* (wherein second imaginary line 408*a* extends the intake port direction with respect to faceplate 102).

Similarly, heated air exhaust port 304 can be formed at second angle $\beta$, wherein second angle $\beta$ is the angle between first imaginary line 406*b* (a line that is orthogonal or perpendicular to an outer surface of faceplate 102) and second imaginary line 408*b* (wherein second imaginary line 408*b* extends the exhaust port direction with respect to faceplate 102).

Thus, according to aspects of the embodiments, first and second angles $\alpha$, $\beta$ can be acute but oppositely directed with respect to a normal of the surface of faceplate 102. According to further aspects of the embodiments, cool air intake ports 302 can be cater-cornered with respect to heated air exhaust ports 304. According to further aspects of the embodiments, first and second angles $\alpha$, $\beta$ can be the same, or different angular values. Furthermore, there can be different numbers of cool air intake ports 302 versus heated air exhaust ports 304, or the number of intake ports 302 can be the same as the number of heated air exhaust ports 304 (as the non-limiting example of FIG. 4 illustrates). According to further aspects of the embodiments, cool air intake port 302 and heated air exhaust port 304 are not necessarily cater-cornered with respect to each other, but need only be separated a certain minimum distance from each other. Note that in FIG. 4, external AV connector 120 has been omitted in fulfillment of the dual purposes of clarity and brevity. According to aspects of the embodiments, first and second angles α, β can both be 0° (i.e., first and second imaginary lines 406*a,b* being substantially perpendicular to the surface of faceplate 102); first and second angles α, β can both be about 90° (as those of skill in the art can appreciate, if either or both of first and second angles α, β were 90°, then respective cool air intake port 302 and/or heated air exhaust port 304 would not pass through faceplate 102; therefore an angle of 90° for either or both of first and second angles α, β is not possible, and in practicality each of first and second angles α, β is limited to about) 85°; and first and second angles α, β can both be different from each other (including practically any acute angle). According to further aspects of the embodiments, first and second angles α, β are optimally about 45°, and can range from about 40° to about 50°.

Figure 5:
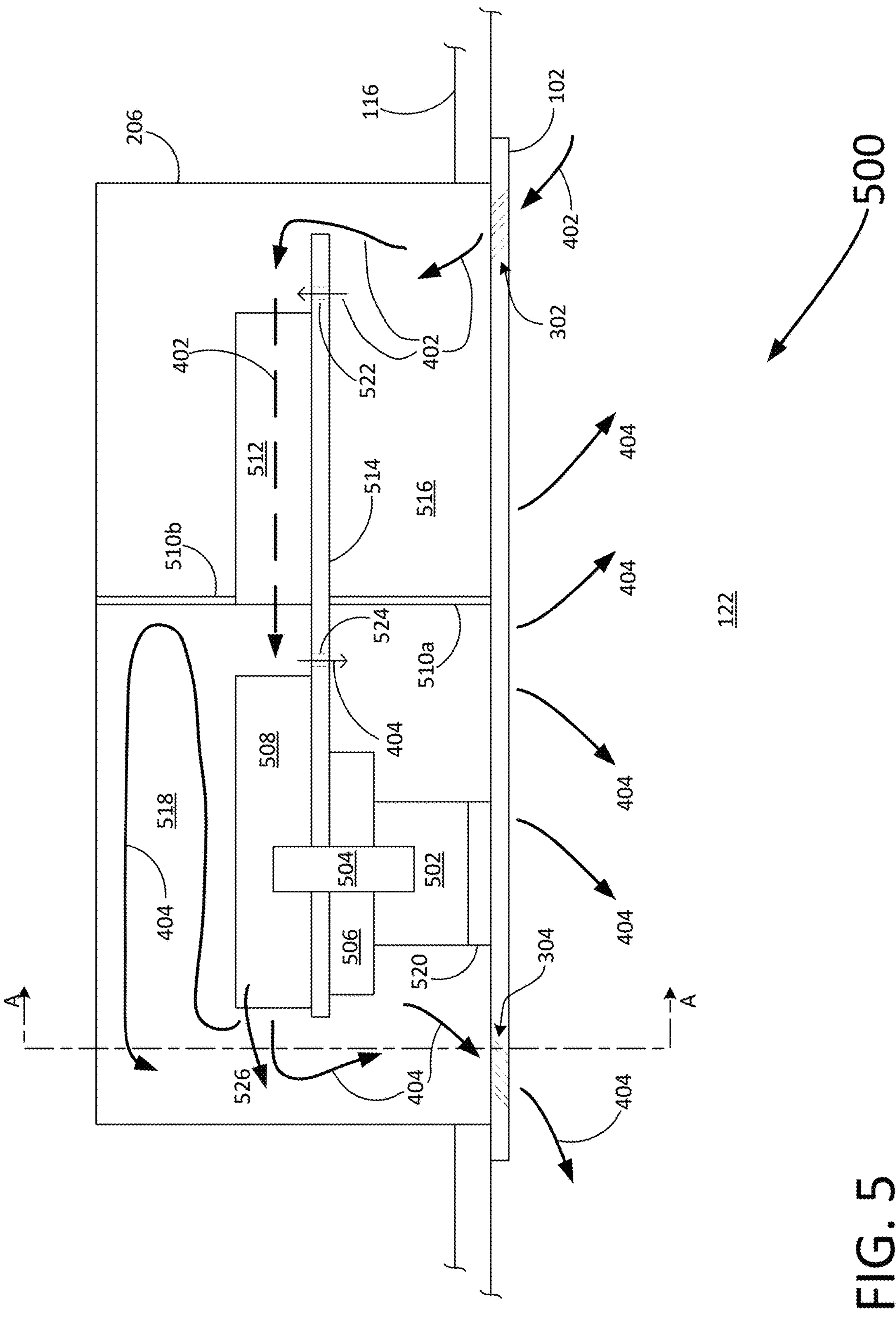
FIG. 5 illustrates a top view of the audio video circuitry housing of FIGS. 2 and 3 with the dual mode cooling system according to aspects of the embodiments.

Shown in FIG. 5 are cool air holes 522 and heated air holes 524 in printed circuit board (PCB) 514. Cool air 402 flows through one or more cool air holes 522 that can be located in PCB 514 in cool air baffle zone 516 according to aspects of the embodiments. The placement of cool air holes 522 in FIG. 5 is but by way of non-limiting example only; the actual placement will be dictated by the placement of circuit components and available space on PCB 514, and the same applies to heated air holes 524 according to aspects of the embodiments. Cool air holes 522 allow cool air 402 to flow more easily into the area of AVCH 206 where centrifugal fan (CF) 512 is located. According to aspects of the embodiment, CF 512 can also be an axial fan. Similarly, heated air holes 524 allow heated air 404 to flow more easily from heated air baffle zone 518 within the area of AVCH 206 that is further away from heated air exhaust ports 304 to the area that is closer to heated air exhaust ports 304 according to aspects of the embodiments.

Figure 2:
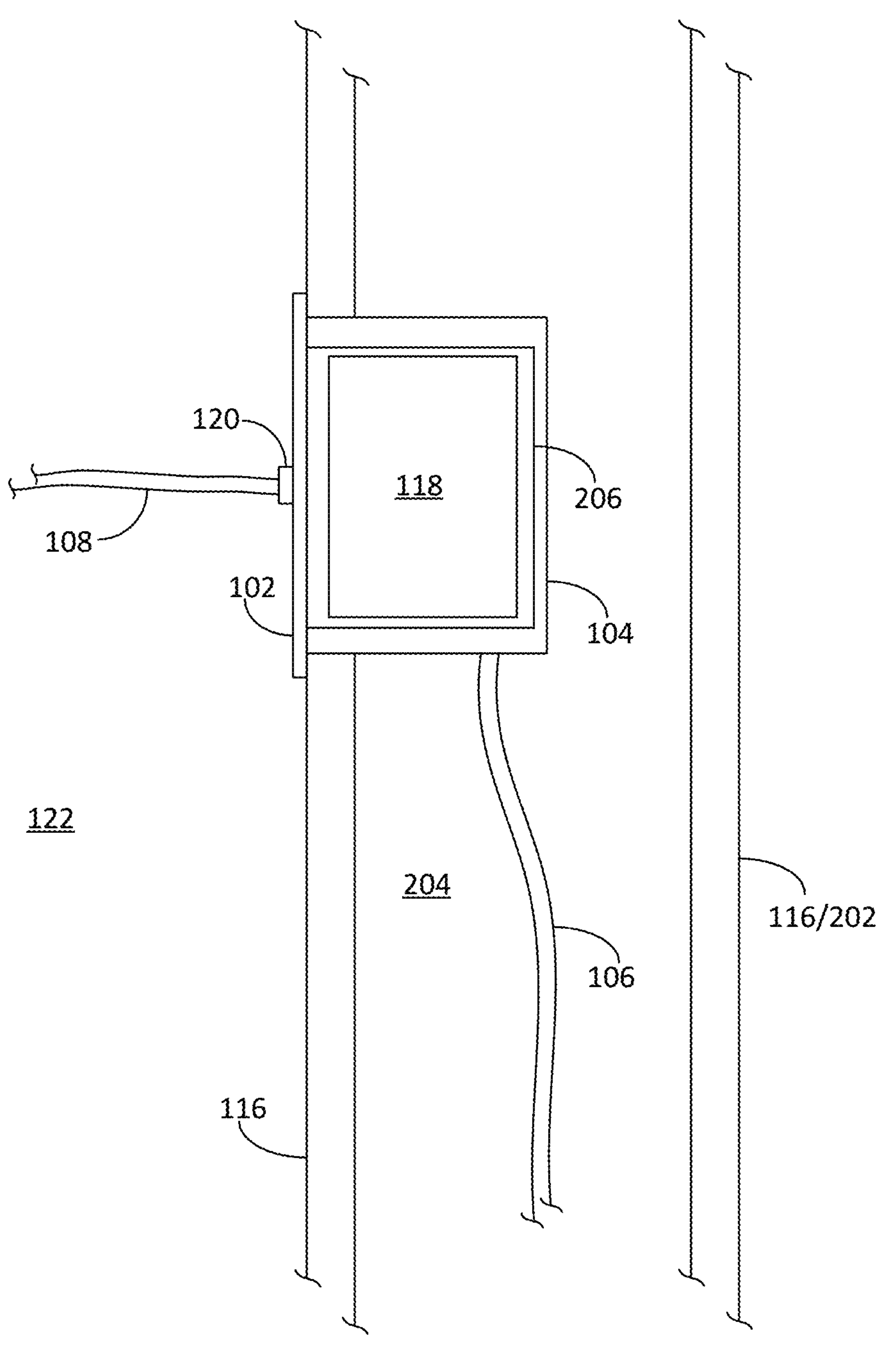
FIG. 2 illustrates a cut-away side view of the audio-video circuitry housing within a gang box installed in the interior wall as shown in FIG. 1.
Figure 6:
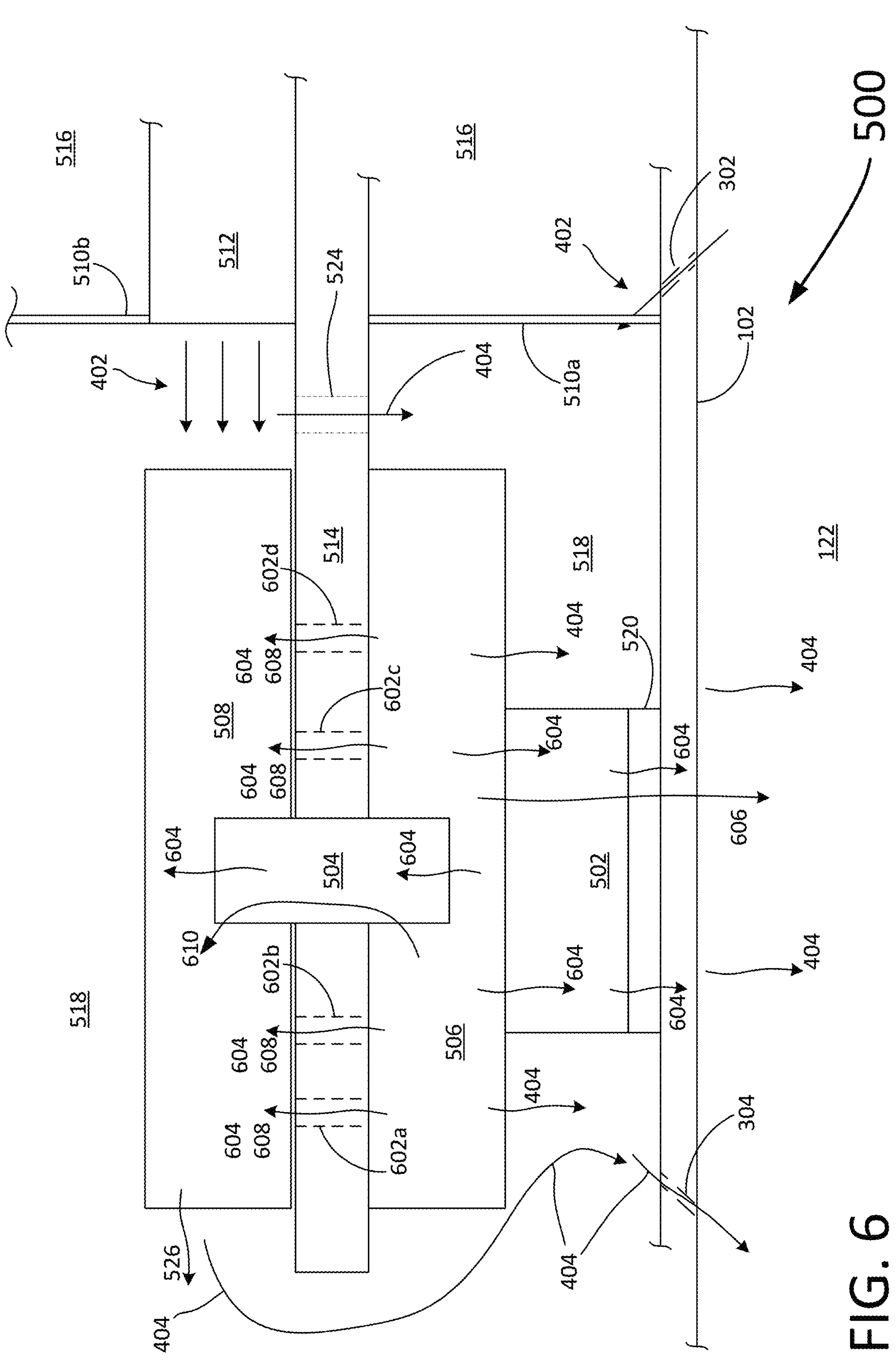
FIG. 6 illustrates a detailed top view of a portion of the view shown in FIG. 5 according to aspects of the embodiments.

FIG. 5 illustrates a top view of AVCH 206 of FIGS. 2 and 3 with dual mode cooling system 500 according to aspects of the embodiments, and FIG. 6 illustrates a detailed top view of a portion of the view shown in FIG. 5 according to aspects of the embodiments. Dual mode cooling assembly 500 comprises faceplate 102 with cool air intake ports 302 and heated air exhaust ports 304, heat conducting metal block (HCMB) 502, gap pad 520, heat pipe 504, finned heat sink (FHS) 508, CF 512, through hole thermal via (thermal via) 602 (shown in FIG. 6), and baffles 510*a,b* according to aspects of the embodiments. Shown also in FIG. 5 is a single IC 506, although it typically would be the case that there would be numerous and different ICs 506*n-m*; however, for the purposes of this discussion, and to simply the drawings figures to the extent possible to appreciate the different aspects of the embodiments, it will be presumed that the majority of the heat is generated by the one IC 506, and dual mode cooling assembly 500 has been implemented in the manner shown to expel the heat generated by IC 506 as quickly and quietly as possible according to aspects of the embodiments.

As discussed above, AVCH 206 and gang box 104 are both substantially sealed devices, with very little if any additional ports for heated air 404 to be expelled other than through the mechanisms of the aspects of the embodiments. Particularly, dual mode cooling assembly 500 has been designed and implemented to disperse heat generated by all of AV circuitry 118 or any heat generating circuitry and in particular IC 506 through only heated air exhaust ports 304 (via convection) and through faceplate 102 (mainly through via conduction and convection, and some radiation) according to aspects of the embodiments.

Thus, for purposes of this discussion, in fulfillment of the dual purposes of clarity and brevity, it shall be presumed that the majority of heat to be dispersed from the interior of AVCH 206 (and thus gang box 104) is generated by IC 506. As those of skill in the art can appreciate, there are three main ways heat can be transferred: conduction (through one solid material to another); convection (heat transferred through liquids or gases); or radiation (as electromagnetic radiation). Most of the heat in dual mode cooling assembly 500 is transferred via conduction and convection while in an active cooling mode, and while in the passive cooling mode, all three modes of heat transfer will be active.

As shown in FIG. 5, cool air 402 enters AVCH 206 via cool air intake ports 302, and enters cool air baffle zone 516. Cool air baffle zone 516 is formed by baffles 510*a,b*, which essentially divides the interior volume of AVCH 206 into two separate volumes, the second being heated air baffle zone 518. Baffle zones 516, 518 are appropriately sized to maximize the intake of enough cool air 402 to remove as much heat as possible, and further maximize the exhaust of heated air 404 to the exterior of AVCH 206 through heated air exhaust ports 304.

Cool air 402 is drawn into AVCH 206 through cool air intake ports 302 by CF 512. Cool air 402 is then directed through the fins of FHS 508, where heat that has been transferred via conduction is convected away by a convection flow of cool air 402. The fins of FHS 508 can be regarded as high density, meaning the fins are appropriately spaced closely together to achieve a maximum amount of surface area from which heat can be transferred from the fins of FHS 508 to cool air 402 that is forced past the fins via CF 512 according to aspects of the embodiments.

Also shown in FIG. 5 is HCMB 502 that is mounted on top of IC 506, and conducts heat from IC 506 through gap pad 520 to faceplate 102 via conduction according to aspects of the embodiments. Gap pad 520 is generally made of a flexible material that is compressible such that HCMB 502 is thermally connected to faceplate 102 and provides a suitable mechanical fit. According to further aspects of the embodiments, heat pipe 504 conducts heat from IC 506 and HCMB 502 to FHS 508. The number and placement of the heat conducting elements shown in FIGS. 5-8 is not meant to be taking in a limiting manner, but is only an example of how such elements can be arranged, and/or how many of such elements can be used in dual mode cooling assembly 500 according to aspects of the embodiments.

Referring now to FIG. 6, which illustrates a detailed top view of a portion of the view shown in FIG. 5, certain portions of the heat flow within dual mode cooling assembly 500 are shown in detail. IC 506 generates heat, and some of that heat flows via heat pipe 504 as conducted heat 604, into FHS 508. Conducted heat 604 also flows from IC 506 into HCMB 502 then through gap pad 520 to faceplate 102 and out of faceplate 102 as heated air 404. According to aspects of the embodiments, heat transferred through the thermally interconnected objects such as IC 506, HCMB 502, gap pad 520, and faceplate 102 can be referred to as a passive cooling path. Thus, faceplate 102, in concert with HCMB 502, acts as a large heat sink to the heat generated by IC 506 according to aspects of the embodiments.

Heated air 404 (heat transferred by convection) also flows from IC 506 into the interior space of AVCH 206, which is heated air baffle zone 518. Some of the heat in heated air 404 travels through faceplate 102 to the exterior of AVCH 206 and gang box 104 (e.g., interior area.

Heat that is generated by IC 506 flows from IC 506 through thermal vias 602*a-d* as conducted heat 604, wherein each thermal via 602 is built into PCB 514 according to aspects of the embodiment. As those of skill in the art can appreciate, vias can be used in PCBs to provide a ground, power, or signal path between different planes of a PCB. Vias are especially useful when additional current flow is needed between power planes or ground planes of a PCB. Such vias are typically hollow, cylindrically shaped filled with solder during the soldering process (though of course the vias need not necessarily be cylindrical in shape). Conducted heat 604 flowing through thermal via 602 into FHS 508 can also be referred to as a passive cooling path, according to aspects of the embodiments.

As shown in FIGS. 5-8, CF 512 forces cool air 402 about the fins of FHS 508, extracting heat from the fins via convection, and this transfer of heat can be referred to as an active cooling path, according to further aspects of the embodiments. As cool air 402 passes through the fins of FHS 508, heat is transferred to the air to form heated air 404 that is exhausted out of heated air exhaust air ports 304 according to aspects of the embodiments. Thus, dual mode cooling assembly 500 comprises both active and passive cooling paths. As shown in FIGS. 5 and 6, respectively, first active cooling path 526 comprises the convective transfer of heat from FHS 508 to the interior of AVCH 206, in heated air baffle zone 518 according to aspects of the embodiments. Heated air baffle zone 518 also receives heat from IC 506 via second and third passive cooling paths 608, 610, which transfers the heat via conduction to the fins of FHS 508. The heat that has then been transferred to the fins of FHS 508 is then transferred to heated air baffle zone via first active cooling path 526 cool air 402 moving over the fins of FHS 508 and removing the heat via convection. First passive cooling path 606 transfers heat via conduction from IC 506 to faceplate 102 (in the manner described above) through HCMB 502 and gap pad 520; heat is then dissipated convectively from faceplate 102 into interior area 122. Second passive cooling path 608 comprises the flow or transfer of heat from IC 506 through thermal vias 602 into FHS 508 according to aspects of the embodiments. Third passive cooling path 610 comprises the flow or transfer of heat from IC 506 through heat pipe 504 into FHS 508 according to aspects of the embodiments.

Figure 7:
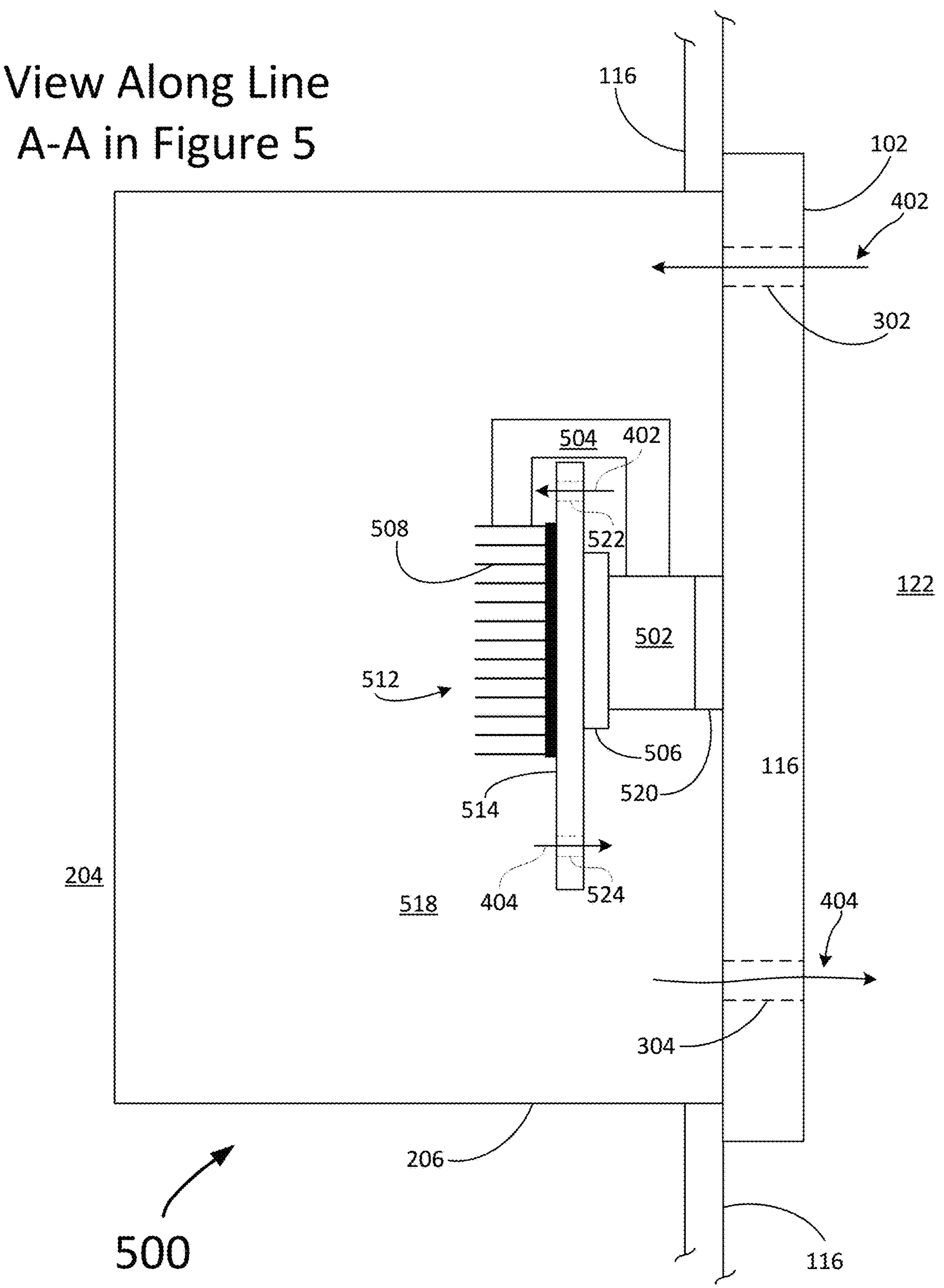
FIG. 7 illustrates a sectional view along line A-A of FIG. 5 according to aspects of the embodiments.
Figure 8:
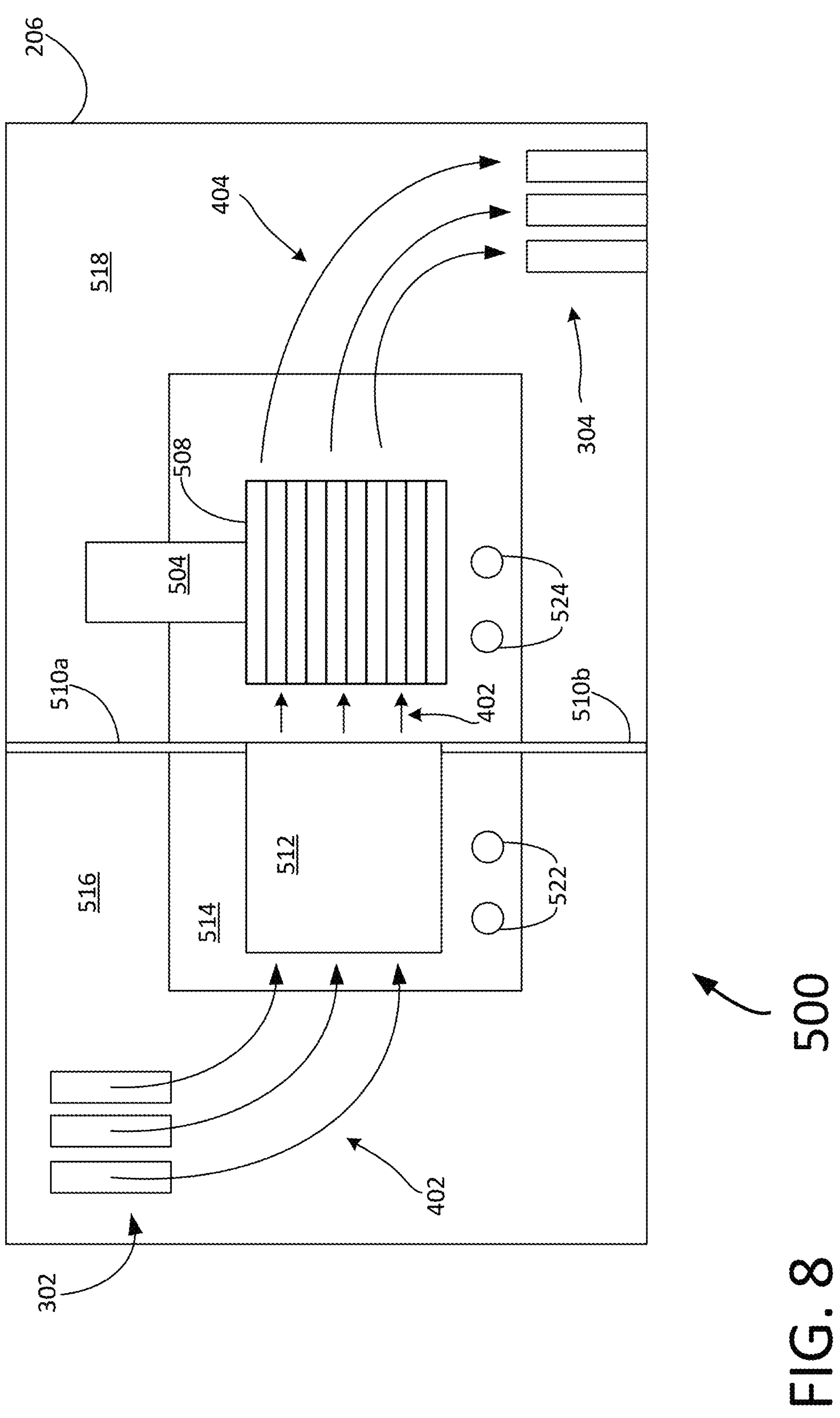
FIG. 8 illustrates a rear view of the dual mode cooling system shown in FIG. 5 according to aspects of the embodiments.

FIG. 7 illustrates a sectional view along line A-A of FIG. 5 according to aspects of the embodiments, and FIG. 8 illustrates a rear view of dual mode cooling system 500 according to aspects of the embodiments.

According to aspects of the embodiments, the amount of heat transfer between IC 506 and faceplate 102 can be tuned so that the touchable surfaces do not become too hot by adjusting the size/surface area of HCMB 502 and the thermal impedance of gap pad 520 used to transfer heat from HCMB 502 to faceplate 102. The thermal impedance of gap pad 520 can be determined by the material used, the contact surface area and the thickness of gap pad 520.

The thermal impedance from IC 506 to FHS 508 can also be tuned by changing the material used (copper, aluminum alloy, among other metals and/or materials (such as carbon composite materials)) in FHS 508, changing its cross sectional area or by incorporating one or more thermal vias 602 (as shown in FIG. 6).

Gang boxes 104 and AVCH 206 are relatively shallow, and thus positioning of CF 512 in line with FHS 508 may not be possible. In this case, CF 512 can be rotated about 90° with respect to FHS 508 and use features of the enclosure (interior of AVCH 206) to provide a curved transition as the air makes a turn to reduce the air flow resistance.

In addition to the active cooling required to remove the run-time heat (i.e., the heat generated while AV circuitry 118 is operating (i.e., active cooling path)), it is desirable to also have a passive cooling solution (i.e., passive cooling path), as described above, that can allow shutting off CF 512 when AV circuitry 118 is in a low power state. Such low power state can include a state in which all or substantially all of the circuitry is in an inactive state. An inactive state can include a condition of electronic circuitry not actively processing AV signals. Even in an inactive state (no AV signals being processed), the circuitry will still continue to generate some heat because power is applied to all or some of the circuitry and will therefore generate some heat.

In addition, it is desirable that a wall plate video receiver located behind a television in a bedroom be as silent as possible when the television is turned off, and the occupants are sleeping (because the fans have been shut off). For a period of time following shut down of active AV signal processing, the circuitry inside the wall plate video receiver will still emit significant amounts of heat for a period of time following shut off. Aspects of the embodiments provide for an efficient manner of cooling even after shutdown of heat generating ICs 506 and therefore CF 512, such that temperatures on faceplate 102 following shut down remain at or below a safe temperature. Such a temperature can be about 70° C., according to the Underwriter's Laboratories/International Electrotechnical Commission UL/IEC 62368 standard. Aspects of the embodiments described herein provide for such cooling by conducting the heat to a first predetermined area of the faceplate of sufficient size such that any heat present just following shutdown is spread to a large enough area to affect such safe transfer of heat.

Figure 9:
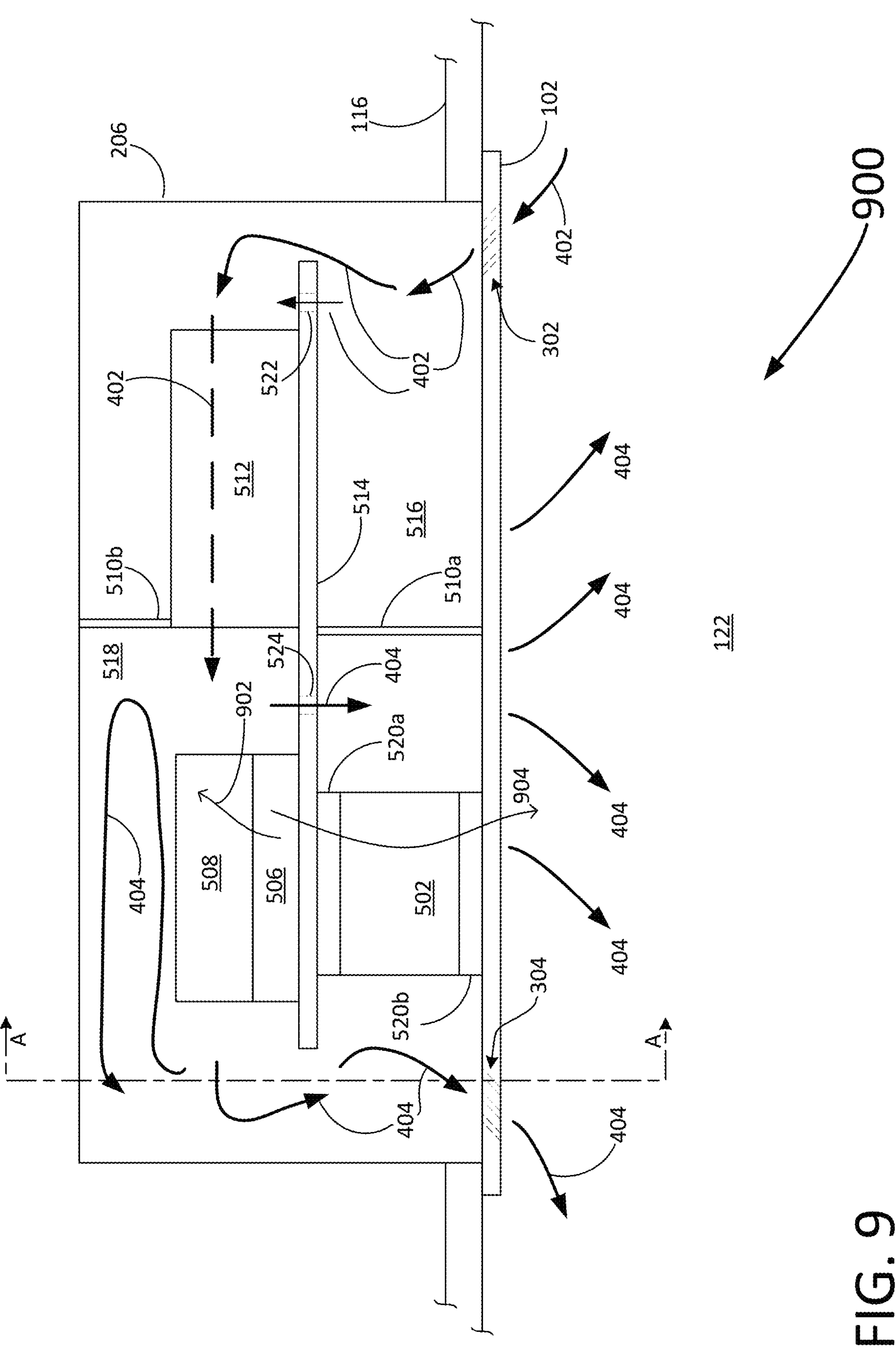
FIG. 9 illustrates a top view of the audio video circuitry housing of FIGS. 2 and 3 with a second dual mode cooling system according to further aspects of the embodiments, substantially similar to the view of FIG. 5.
Figure 10:
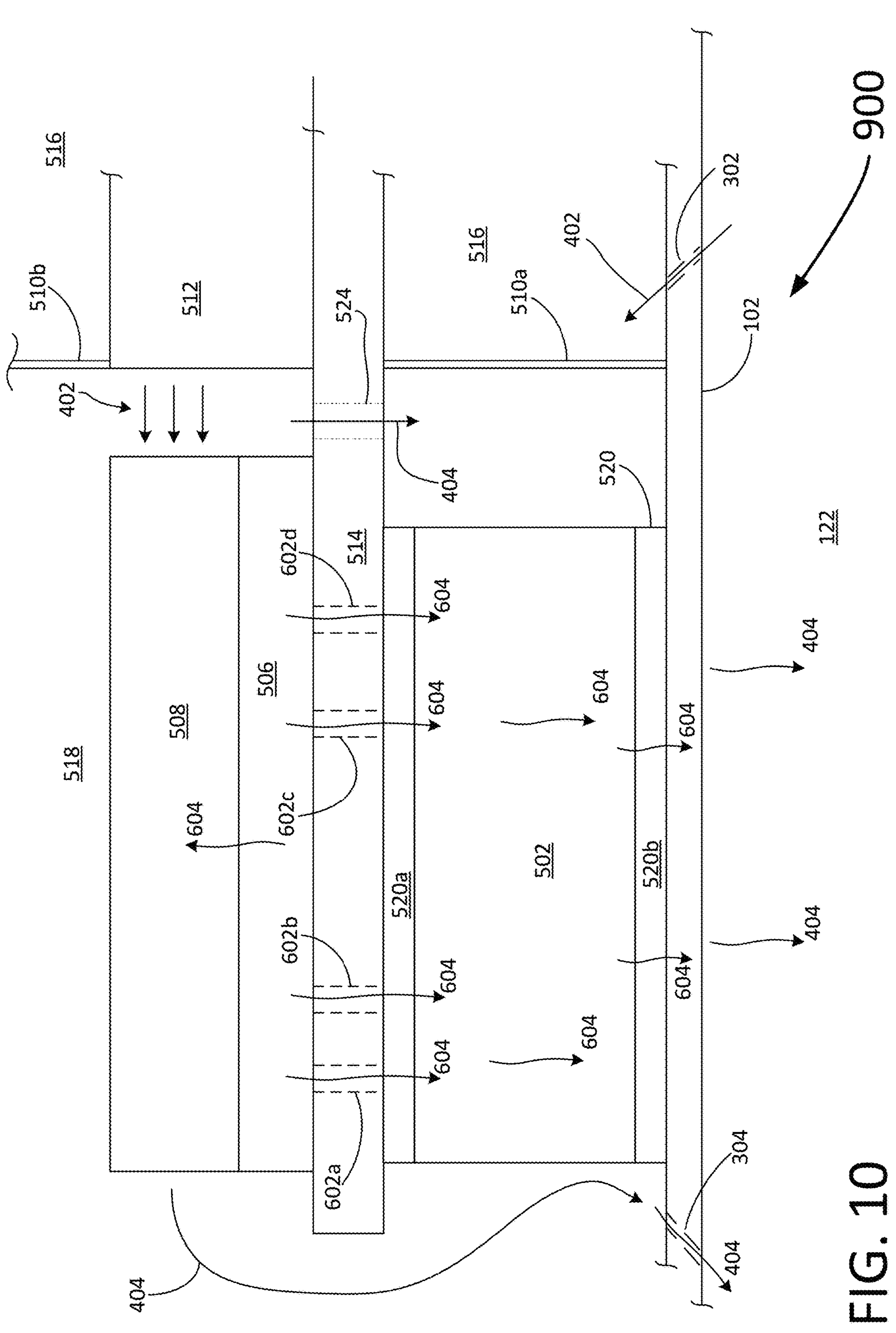
FIG. 10 illustrates a detailed top view of a portion of the view shown in FIG. 9 according to aspects of the embodiments.

FIG. 9 illustrates a top view of the gang box of FIGS. 2 and 3 with a dual mode cooling system according to further aspects of the embodiments, substantially similar to the view of FIG. 5, and FIG. 10 illustrates a detailed top view of a portion of the view shown in FIG. 9 according to aspects of the embodiments.

The aspects of the embodiments shown in FIGS. 9 and 10 are substantially similar to the aspects of the embodiments shown in FIGS. 2-8; therefore, in fulfillment of the dual purposes of brevity and clarity, a detailed discussion of the substantially similar portions has been omitted from herein. FIG. 9 illustrates a top view of AVCH 206 of FIGS. 2 and 3 with second dual mode cooling system 900 according to aspects of the embodiments, and FIG. 10 illustrates a detailed top view of a portion of the view shown in FIG. 9 according to aspects of the embodiments. Second dual mode cooling assembly 900 comprises faceplate 102 with cool air intake ports 302 and heated air exhaust ports 304, HCMB 502, gap pad 520, heat pipe 504, finned heat sink (FHS) 508, CF 512, thermal via 602 (shown in FIG. 10), and baffles 510*a,b* according to aspects of the embodiments. Shown also in FIG. 9 is a single IC 506, although it typically would be the case that there would be numerous and different ICs 506*n-m*; however, for the purposes of this discussion, and to simply the drawings figures to the extent possible to appreciate the different aspects of the embodiments, it will be presumed that the majority of the heat is generated by the one IC 506, and second dual mode cooling assembly 900 has been implemented in the manner shown to dissipate the heat generated by IC 506 as quickly and quietly as possible according to aspects of the embodiments. The aspects of the embodiments of second dual mode cooling system 900 differs from that of FIG. 5 and dual mode cooling system 500 in that IC 506 is now on an opposite side of PCB 514, and heat pipe 504 is omitted.

As with dual mode cooling system 500, the majority of the heat in second dual mode cooling assembly 900 is transferred via conduction and convection.

As shown in FIG. 9, cool air 402 enters AVCH 206 via cool air intake ports 302, and enters cool air baffle zone 516. Cool air baffle zone 516 is formed by baffles 510*a,b*, which essentially divides the interior volume of AVCH 206 into two separate volumes, the second being heated air baffle zone 518. Baffle zones 516, 518 are appropriately sized to maximize the intake of enough cool air 402 to remove as much heat as possible, and further maximize the exhaust of heated air 404 to the exterior of AVCH 206 through heated air exhaust ports 304.

Cool air 402 is drawn into AVCH 206 through cool air intake ports 302 by CF 512. Cool air 402 is then directed through the fins of FHS 508, where heat that has been transferred via conduction is convected away by a convection flow of cool air 402. In second dual mode cooling system 900, FHS 508 is mounted directly on top of IC 506 according to aspects of the embodiments. The fins of FHS 508 can be regarded as high density, meaning the fins are appropriately spaced closely together to achieve a maximum amount of surface area from which heat can be transferred from the fins of FHS 508 to cool air 402 that is forced past the fins via CF 512 according to aspects of the embodiments.

Also shown in FIG. 9 are cool air holes 522 in PCB 514 and heated air holes 524 in PCB 514. Cool air 402 flows through one or more cool air holes 522 that can be located in PCB 514 in cool air baffle zone 516 according to aspects of the embodiments. The placement of cool air holes 522 in FIG. 9 is but by way of non-limiting example only; the actual placement will be dictated by the placement of circuit components and available space on PCB 514, and the same applies to heated air holes 524 according to aspects of the embodiments. Cool air holes 522 allow cool air 402 to flow into the area of AVCH 206 where CF 512 is located more easily. Similarly, heated air holes 524 allow heated air 404 to flow more easily from the area of AVCH 206 in heated air baffle zone 518 that is further away from heated air exhaust ports 314 to the area that is closer to heated air exhaust ports 314 according to aspects of the embodiments.

Also shown in FIG. 9 is heat conducting metal block (HCMB) 502 that mounts on top of gap pad 520*a* that mounts onto PCB 514. Heat from IC 506 is transferred through PCB 514, but more efficiently through thermal vias 602 (shown in FIG. 10) to gap pad 520*a*. The heat from IC 506 then travels through gap pad 520*a* to HCMB 502, which then conducts the heat from IC 506 through second gap pad 520*b* to faceplate 102 according to aspects of the embodiments. Most of the heat in the area of gap pad 520*a* from IC 506 is transferred to faceplate 102 is via conduction, and the heat that is transferred to faceplate 102 is then transferred via convention to interior area 122 of room 100.

Gap pad 520 is generally made of a flexible material that is compressible such that HCMB 502 is thermally connected to faceplate 102 and provides a suitable mechanical fit. According to further aspects of the embodiments, heat pipe 504 could be included to conduct heat from IC 506 to HCMB 502 to faceplate 102. The number and placement of the heat conducting elements shown in FIGS. 9 and 10 is not meant to be taking in a limiting manner, but is only an example of how such elements can be arranged, and/or how many of such elements can be used in second dual mode cooling assembly 900 according to aspects of the embodiments.

Referring now to FIG. 10, which is a partial view of FIG. 9, certain portions of the heat flow are shown in detail. IC 506 generates heat that is then transferred to FHS 508. Heat generated by IC 506 also is transferred to HCMB 502 through thermal vias 602 in PCB 514, through gap pad 520*a*, then into HCMB 502, then through gap pad 520*b* to faceplate 102 and out of faceplate 102 as heated air 404. According to aspects of the embodiments, heat transferred through the thermally interconnected objects such as IC 506, HCMB 502, gap pad 520, and faceplate 102 can be referred to as a passive heat path. Thus, faceplate 102, in concert with HCMB 502 acts as a large heat sink to the heat generated by IC 506 according to aspects of the embodiments.

Heated air 404 (heat transferred by convection) also flows from IC 506 into the interior space of AVCH 206, which is heated air baffle zone 518. Some of the heat in heated air 404 travels through faceplate 102 to the exterior of AVCH 206 (e.g., interior area 122 of room 100).

Heat that is generated by IC 506 flows from IC 506 through thermal vias 602*a-d* as conducted heat 604, wherein each thermal via 602 is built into PCB 514 according to aspects of the embodiment. As those of skill in the art can appreciate, vias can be used in PCBs to provide a ground, power, or signal path between different planes of a PCB. Vias are especially useful when additional current flow is needed between power planes or ground planes of a PCB. Such vias are typically hollow and cylindrically shaped, and are filled with solder during the soldering process (though of course the vias need not necessarily be cylindrical in shape). According to aspects of the embodiments, thermal vias 602 can be filled with solder during the solder process to increase heat flow from one area to another. Conducted heat 604 flowing through thermal via 602 into FHS 508 can also be referred to as a passive cooling path, according to aspects of the embodiments.

As shown in FIGS. 9 and 10, CF 512 forces cool air 402 between the fins of FHS 508, extracting heat from the fins via convection, and this transfer of heat can be referred to as an active cooling path, according to further aspects of the embodiments. As cool air 402 passes about the fins of FHS 508, heat is transferred to the air to form heated air 404 that is exhausted out through heated air exhaust ports 304 according to aspects of the embodiments. Thus, second dual mode cooling assembly 900 comprises both active and passive cooling paths.

As shown in FIGS. 9-10, CF 512 forces cool air 402 between the fins of FHS 508, extracting heat from the fins via convection, and this transfer of heat can be referred to as an active cooling path, according to further aspects of the embodiments. As cool air 402 passes between the fins of FHS 508, heat is transferred to the air to form heated air 404 that is exhausted out of heated air exhaust ports 304 according to aspects of the embodiments. Thus, dual mode cooling assemblies 500 and 900 comprises both active and passive cooling paths. According to further aspects of the embodiments, dual mode cooling assemblies 500 and 900, as well as 1100, 1300, and 1600 as described in further detail below, can include any combination of passive and active cooling paths, including any one alone or any combination of active and passive cooling paths.

As shown in 9 and 10, respectively, first active cooling path 526 comprises the convective transfer of heat from FHS 508 to the interior of AVCH 206, in heated air baffle zone 518 according to aspects of the embodiments. Heated air baffle zone 518 also receives heat from IC 506 via fourth passive cooling path 902, the transferred heat of which is dissipated into heated air baffle zone 518 via first active cooling path 526. Fourth passive cooling path 902 comprises the flow or transfer of heat from IC 506 into FHS 508 according to aspects of the embodiments. Fifth passive cooling path 904 transfers heat via conduction from IC 506 to faceplate 102 (in the manner described above) through thermal vias 602, gap pad 520*a*, HCMB 502, and gap pad 520*b*; heat is then dissipated convectively from faceplate 102 into interior area 122 of room 100.

Figure 11:
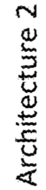
FIGS. 11 and 12 illustrate isometric views of a third dual mode cooling system according to aspects of the embodiments.
Figure 11:
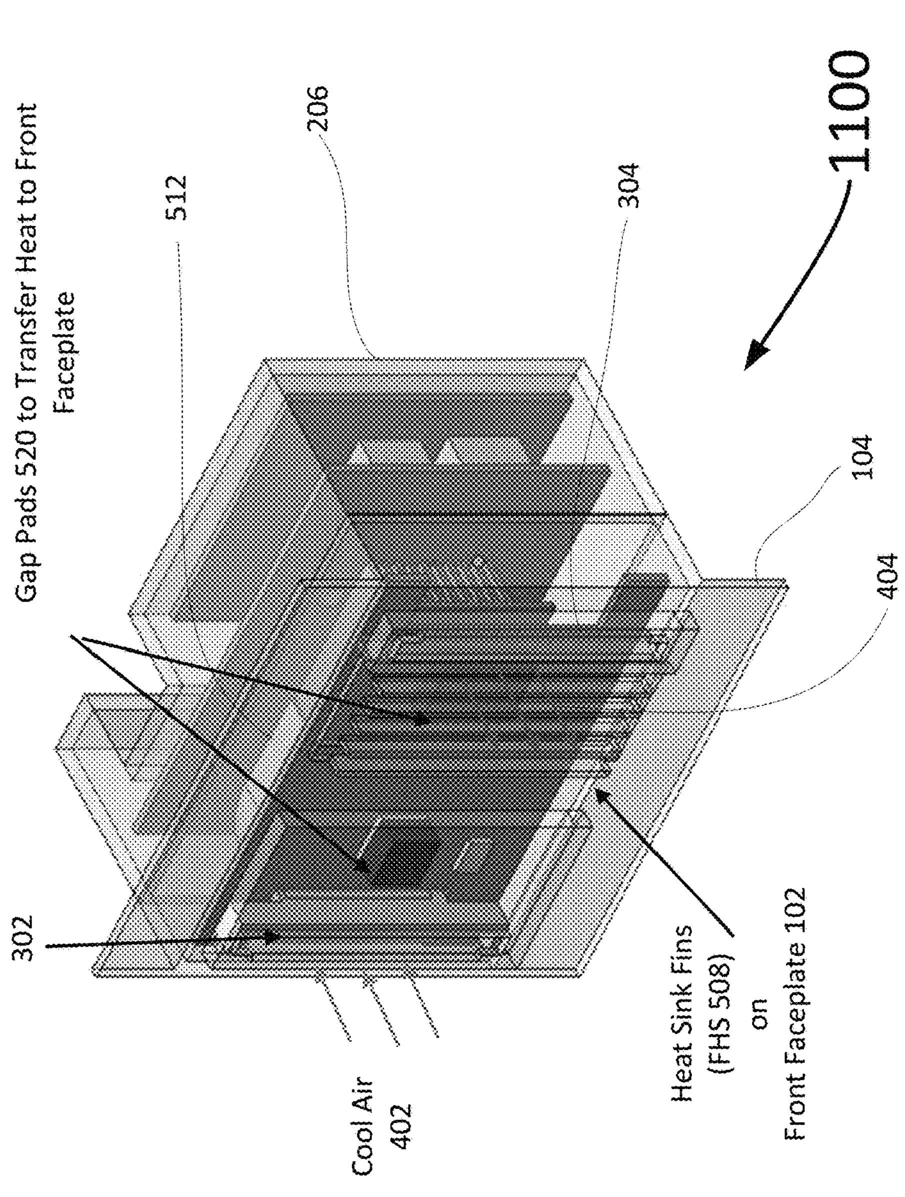
Figure 12:
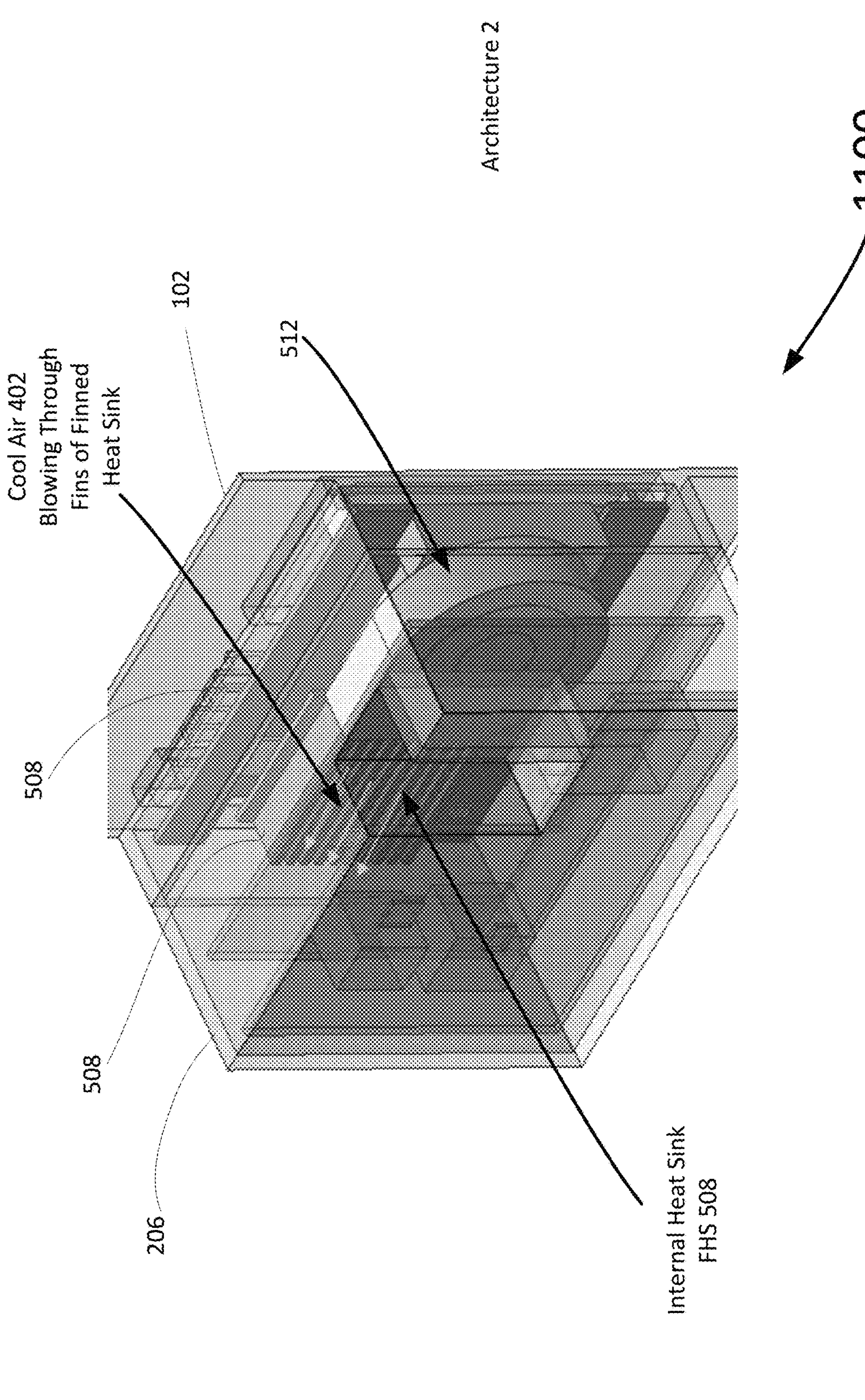

FIGS. 11 and 12 illustrate isometric views of third dual mode cooling system 1100 according to aspects of the embodiments.

According to aspects of the embodiments, third dual mode cooling system 1100 comprises CF 512 (blower) that pulls air into the unit, across FHS 508 and other components, and exhausts the air to interior area 122 of room 100. There are also gap pads 520 that thermally connect IC 506 to faceplate 102, which has exterior fins (FHS 508) to transfer the heat to interior area 122 of room 100 when the fan speed of CF 512 is low or turned off.

Figure 13:
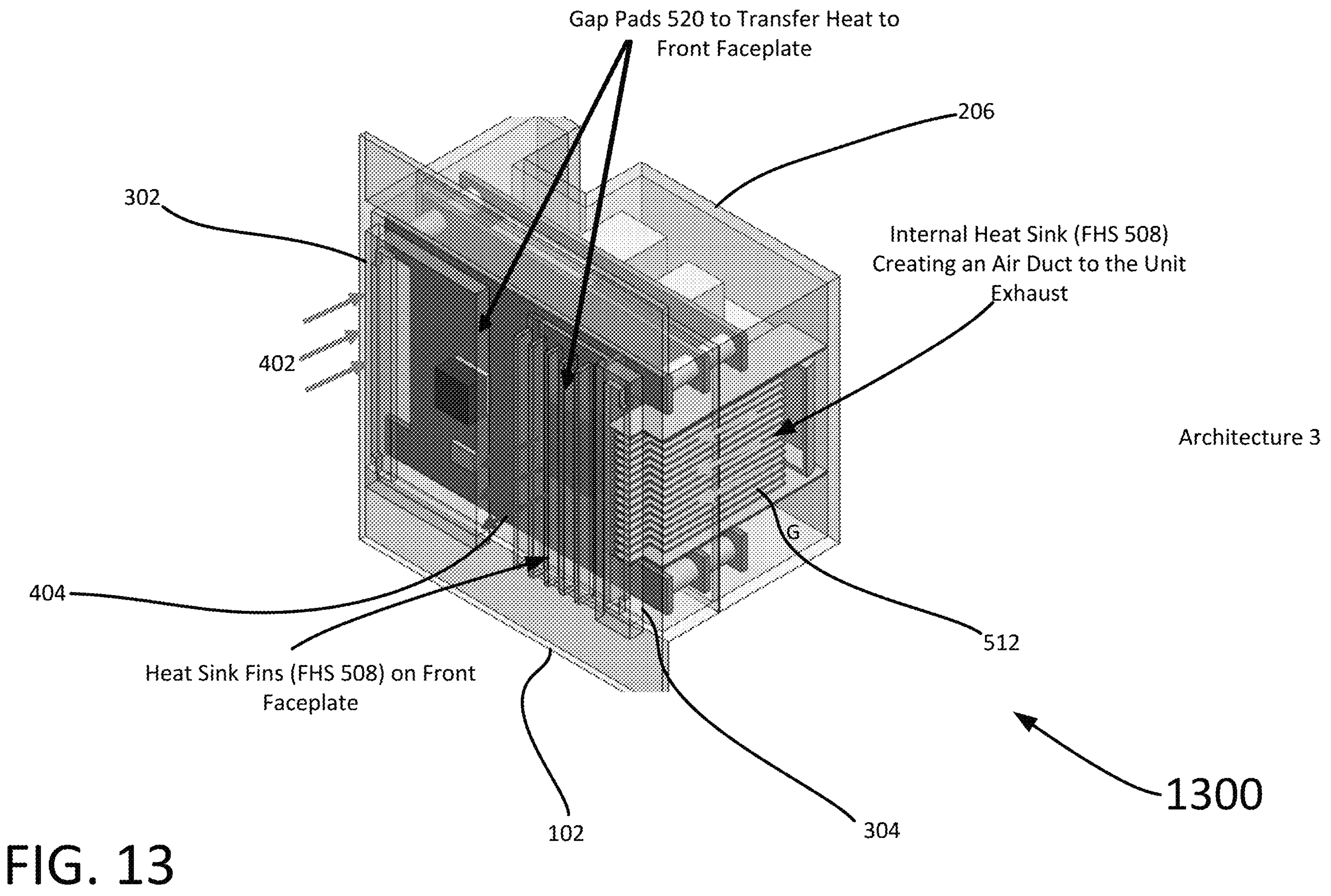
FIGS. 13-15 illustrate isometric views of a fourth dual mode cooling system according to aspects of the embodiments.
Figure 14:
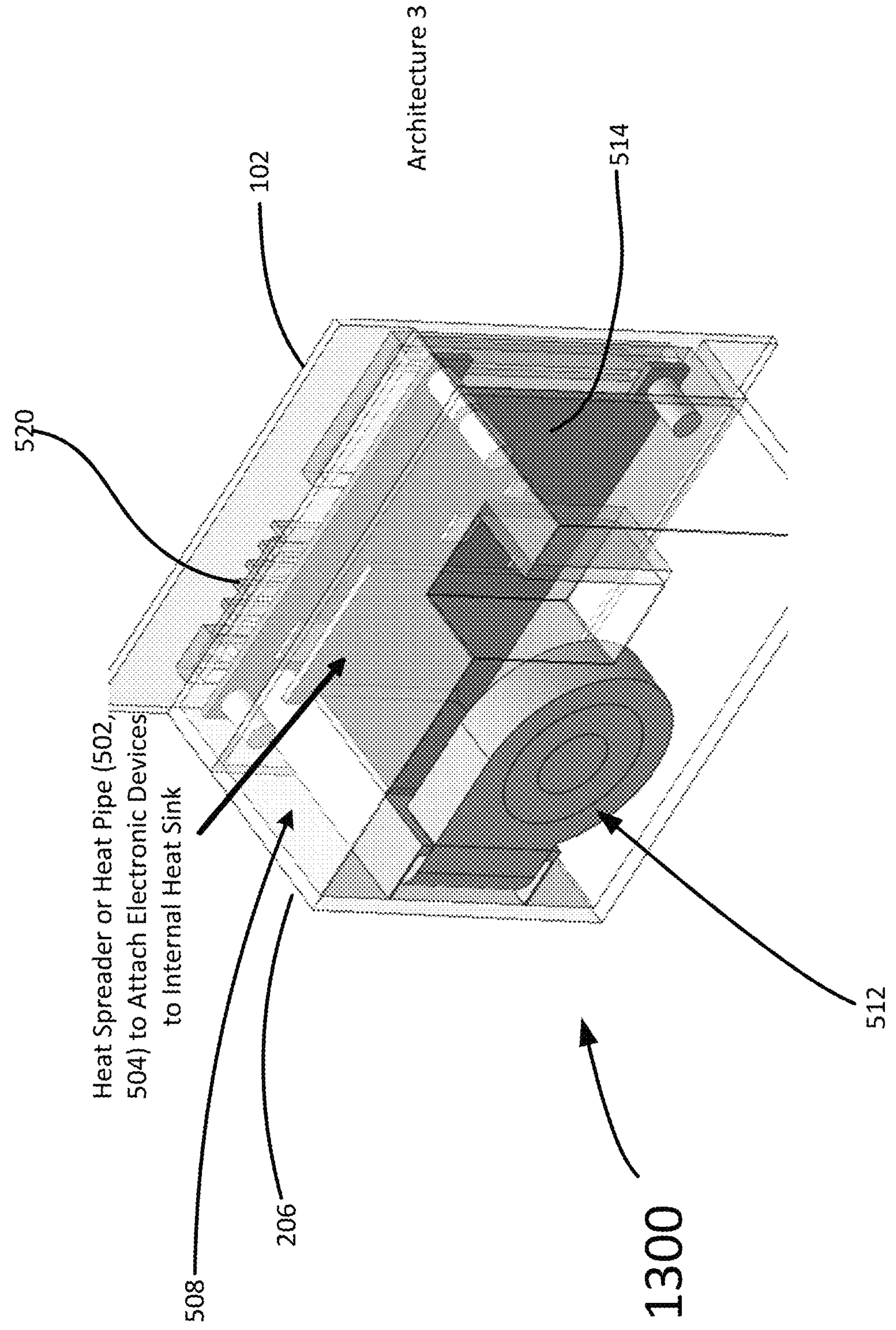
Figure 15:
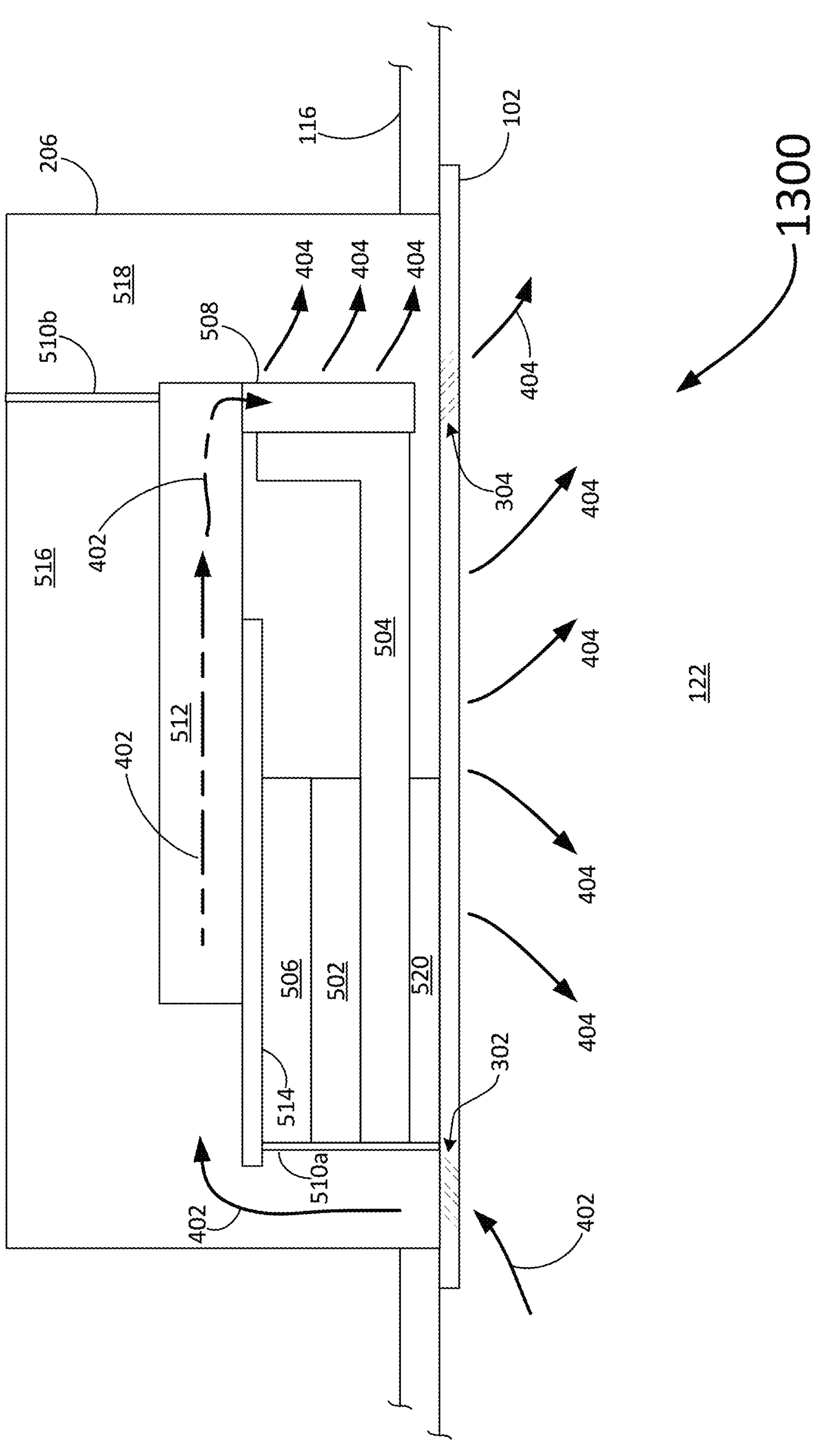

FIGS. 13-15 illustrate isometric views of fourth dual mode cooling 1300 system according to aspects of the embodiments.

According to aspects of the embodiments, fourth dual mode cooling system 1300 comprises CF 512 that pulls cool air 402 into the unit through cool air intake ports 302. Cool air 402 gains heat via heat generating devices (i.e., AV circuitry 118), becoming heated air 404, before entering CF 512. CF 512 then exhausts heated air 404 through the fins of FHS 508 and then out of AVCH 206 via heated air exhaust ports 304. The physical separation between cool air intake ports 302 and heated air exhaust ports 304 provides for the separation of cool air 402 and heated air 404, which optimizes performance of CF 512. There are also gap pads 520 that link the heat-generating electronic devices (e.g., IC 506) to the front faceplate 102, which contains FHS 508, to transfer the heat to the ambient when the fan speed of CF 512 is low or off.

Figure 16:
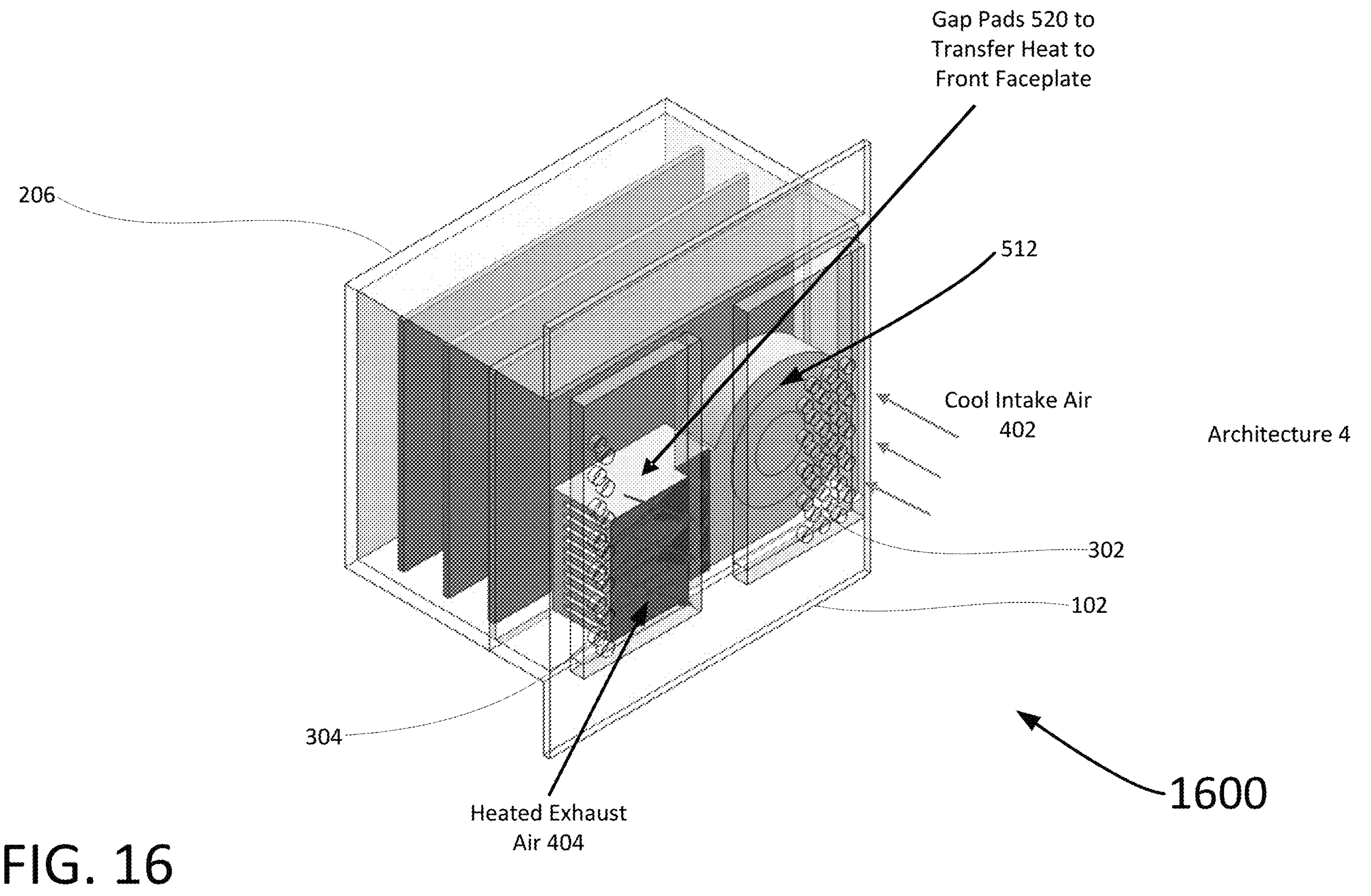
FIG. 16 illustrates an isometric view of a fifth dual mode cooling system according to aspects of the embodiments.

FIG. 16 illustrates an isometric view of fifth dual mode cooling system 1600 according to aspects of the embodiments.

According to aspects of the embodiments, fifth dual mode cooling system 1600 comprises CF 512 that pulls cool air 402 into AVCH 206, circulates cool air 402 about electronic components (IC 506) such that cool air 402 becomes heated air 404, and then exhausts heated air 404 through FHS 508. FHS 508 (not shown), is mounted in such manner that it creates a duct for heated air 404 to exhaust into interior area 122 of room 100. FHS 508 allows for remote cooling as it can utilize HCMB and heat-pipes 502, 504, to attach to heat-generating electronic devices (IC 506) throughout the unit. There are also gap pads 520 that connect the heat-generating electronic devices (IC 506) or FHS 508 to the front faceplate 102, which dissipates the heat to interior area 122 of room 100 when the fan speed of CF 512 is low or turned off.

According to further aspects of the embodiments, dual mode cooling assemblies 500 and 900, as well as 1100, 1300, and 1600 as described in detail above, can include any combination of passive and active cooling paths, including any one alone or any combination of active and passive cooling paths.

As discussed in regard to one or more of the Figures described herein, reference is made to several dimensions (which may include, but is not limited to radii, angles, height, size, volume, among dimensional descriptors), as well as relative positions and/or locations. Those of skill in the art can appreciate that although examples and/or discussions of dimensions/positions/locations are provided, these should not be taken in a limiting manner except as otherwise noted. That is, the aspects of the embodiments are not to be construed as defined or limited by the specific example of the dimensions/positions/locations shown and discussed, but instead are provided merely for illustrating an example of what a device that incorporates the aspects of the embodiments could, in a non-limiting manner, looks like and/or is arranged. Furthermore, as those of skill in the art can appreciate, since the aspects of the embodiments are directed towards a physical object, with dimensions/positions/locations characteristics, all of the parts will have various dimensions/positions/locations, some of which are not shown in fulfillment of the dual purposes of clarity and brevity. According to still further aspects of the embodiments, some of these objects will have dimensions/positions/locations characteristics that lend themselves to aesthetic aspects; in fulfillment of the dual purposes of clarity and brevity, dimensions/positions/locations in this regard may have been omitted. Therefore, as the aspects of the embodiments are directed towards systems, methods, and modes for a dual mode cooling system for electronics with limited access to cooling surfaces or ducts, it is to be understood that some of the dimensions/positions/locations of the different objects have been shown and some dimensions/positions/locations have not been shown, and the inclusion and/or exclusion should be understood by those of skill in the art especially in view of the discussion herein. Attention is now directed towards FIG. 4, The disclosed embodiments provide systems, methods, and modes for a dual mode cooling system for electronics with limited access to cooling surfaces or ducts. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes for a dual mode cooling system for electronics with limited access to cooling surfaces or ducts.

ALTERNATE EMBODIMENTS

Alternate embodiments may be devised without departing from the spirit or the scope of the different aspects of the embodiments.

What is claimed is:

1. A dual mode cooling system, comprising:

electronic heat generating circuitry;

a printed circuit board upon which the electronic heat generating circuitry is located on a first side;

a substantially adiabatic enclosure adapted to house the electronic heat generating circuitry, printed circuit board and other components of the dual mode cooling system;

a finned heat sink adapted to be in thermal contact with the electronic heat generating circuitry, the finned heat sink comprising a plurality of heat radiating fins, each of the plurality of heat radiating fins comprising a plurality of heated surfaces;

a faceplate adapted to enclose the substantially adiabatic enclosure and seal the substantially adiabatic enclosure against an interior wall, and wherein the faceplate comprises— a cool air intake port adapted to receive cool air from an area external to the substantially adiabatic enclosure and provide the cool air to an interior portion of the substantially adiabatic enclosure, and a heated air exhaust port adapted to exhaust heated air out of the substantially adiabatic enclosure into an area external to the substantially adiabatic enclosure;

a fan adapted to receive cool air from the cool air intake port and blow the cool air through the plurality of heat radiating fins of the finned heat sink to remove substantially all of the heat generated by the electronic heat generating circuitry via convection and generate heated air, and wherein the heated air is exhausted through the heated air exhaust port by the fan, and wherein an active cooling path comprises a path of air as it is received from the cool air intake port, passes through the fan, over each of the plurality of heated surfaces, and then is exhausted from the heated air exhaust port, and further wherein, the heated air exhaust port comprises— one or more holes in the faceplate formed at a first acute angle $\beta$ with respect to an imaginary line perpendicular to a surface of the faceplate such that the heated air is expelled away from the faceplate in a first direction, and the cool air intake port comprises— one or more holes in the faceplate formed at a second acute angle $\alpha$ with respect to an imaginary line perpendicular to the surface of the faceplate such that the cool air is ingested into the substantially adiabatic enclosure from a second direction, and wherein the first and second acute angles are in opposition to each other, and further wherein the heated air exhaust port is separated with respect to the cool air intake port; and a first passive cooling path comprising:

the electronic heat generating circuitry;

the printed circuit board upon which the electronic heat generating circuitry is located;

one or more through hole thermal vias located in the printed circuit board that are each adapted to be in thermal contact with the electronic heat generating circuitry and to accept heat generated by the electronic heat generating circuitry and transfer the heat generated by the electronic heat generating circuitry;

a first heat conducting device adapted to be in thermal contact with the one or more through hole thermal vias, and which is adapted to transfer heat via conduction from the one or more through hole thermal vias, and which is further adapted to be a compressible gap pad to form a thermal transfer path between two objects;

a second heat conducting device adapted to be in thermal contact with the first heat conducting device and to accept heat conducted by the first heat conducting device; and a third heat conducting device adopted to be in thermal contact with the second heat conducting device and to accept heat conducted from the first heat conducting device and is further adapted to be compressible to form a thermal transfer path between two objects, and wherein the face plate is adapted to be in thermal contact with the third heat conducting device and to accept heat conducted from the second heat conducting device, and is further adapted to convectively transfer received heat from its surface to air surrounding the face plate.

2. The dual mode cooling system according to claim 1, further comprising:

a second passive cooling path comprising:

the electronic heat generating circuitry; and the finned heat sink located on the electronic heat generating circuitry, and which is adapted to be in thermal contact with the electronic heat generating circuitry and to accept heat conducted from the electronic heat generating circuitry.

3. The dual mode cooling system according to claim 1, wherein the heated air exhaust port is cater cornered with respect to the cool air intake port.

4. The dual mode cooling system according to claim 1, wherein the combination of the passive cooling paths is adapted to transfer heat to and through the faceplate such that following the electronic heat generating circuitry being put into an inactive state and the fan being shut off, the combination of the passive cooling paths convectively transfers heat away from the interior of the substantially adiabatic enclosure through the faceplate such that the faceplate remains at a temperature below an unsafe temperature.

5. The dual mode cooling system according to claim 4, wherein the convective transfer of heat away from the faceplate and interior of the substantially adiabatic enclosure is such that the faceplate remains at a temperature below an unsafe temperature occurs through the conductive transfer of heat to a first area of the faceplate.

6. The dual mode cooling system according to claim 5, wherein the unsafe temperature is about 70° C.

7. The dual mode cooling system according to claim 1, further comprising:

a baffle wall that separates an interior of the substantially adiabatic enclosure into a cool air baffle zone and a heated air baffle zone, such that substantially only cool air is located in the cool air baffle zone and substantially only heated air is located in the heated air baffle zone.

8. The dual mode cooling system according to claim 7, further comprising:

at least one or more holes in the printed circuit board that allow cool air to flow from one side of the printed circuit board to the other side of the printed circuit board in the cool air baffle zone; and at least one or more holes in the printed circuit board that allow heated air to flow from one side of the printed circuit board to the other side of the printed circuit board in the heated air baffle zone.

9. The dual mode cooling system according to claim 1, wherein the faceplate comprises:

at least one audio video signal connector.

10. The dual mode cooling system according to claim 1, wherein the electronic heat generating circuitry comprises:

audio-video processing circuitry.

11. The dual mode cooling system according to claim 1, wherein the substantially adiabatic enclosure comprises:

a standard gang box.

12. The dual mode cooling system according to claim 11, wherein the standard gang box can be located within an insulated wall.

13. The dual mode cooling system according to claim 1, further comprising:

one or more through hole thermal vias located in the printed circuit board that are each adapted to be in thermal contact with the electronic heat generating circuitry and to accept heat generated by the electronic heat generating circuitry and to transfer the same to the finned heat sink, the finned heat sink located on a second side of the printed circuit board.

14. The dual mode cooling system according to claim 1, wherein the cool air intake port comprises— one or more holes in the faceplate formed at an angle $\alpha$ with respect to a first imaginary line that is formed perpendicular to an outer surface of the faceplate, such that the cool air is ingested into the substantially adiabatic enclosure from a first direction, and wherein the heated air exhaust portal comprises— one or more holes in the faceplate formed at an angle $\beta$ with respect to a second imaginary line that is formed perpendicular to the outer surface of the faceplate such that the heated exhaust air is expelled away from the faceplate in a second direction.

15. The dual mode cooling system according to claim 14, wherein the angle $\alpha$ and the angle $\beta$ are each about 0°.

16. The dual mode cooling system according to claim 14, wherein the angle $\alpha$ is an acute angle and the angle $\beta$ is about 0°.

17. The dual mode cooling system according to claim 14, wherein the cool air intake port formed at the angle $\alpha$ points away from the heated air exhaust port formed at the angle $\beta$.

18. The dual mode cooling system according to claim 14, wherein the angle $\alpha$ is about 0° and the angle $\beta$ is an acute angle.

19. The dual mode cooling system according to claim 14, wherein the angle $\alpha$ is an acute angle and the angle $\beta$ is an acute angle.

20. An audio-video distribution system, comprising:

an audio-video encoder adapted to receive at least one high definition multimedia interface (HDMI) encoded audio-video (AV) signal via an HDMI cable, encode the same as an AV-over-internet protocol (AV-over-IP) signal, transmit the AV-over-IP signal to an AV receiver/splitter, wherein the AV receiver/splitter is adapted to receive the AV-over-IP signal, split the audio portion from the video portion of the AV-over-IP signal, convert the video portion back to an HDMI encoded video signal, re-transmit the HDMI encoded video signal to a display that is adapted to display an HDMI encoded video signal, and re-transmit the audio portion to one or more loudspeakers, and wherein the audio-video encoder comprises— electronic heat generating circuitry;

a printed circuit board upon which the electronic heat generating circuitry is located on a first side;

a substantially adiabatic enclosure adapted to house the electronic heat generating circuitry, printed circuit board and other components of the dual mode cooling system;

a finned heat sink adapted to be in thermal contact with the electronic heat generating circuitry, the finned heat sink comprising a plurality of heat radiating fins, each of the plurality of heat radiating fins comprising a plurality of heated surfaces;

a faceplate adapted to enclose the substantially adiabatic enclosure and seal the substantially adiabatic enclosure against an interior wall, and wherein the faceplate comprises— a cool air intake port adapted to receive cool air from an area external to the substantially adiabatic enclosure and provide the cool air to an interior portion of the substantially adiabatic enclosure, and a heated air exhaust port adapted to exhaust heated air out of the substantially adiabatic enclosure into an area external to the substantially adiabatic enclosure;

a fan adapted to receive cool air from the cool air intake port and blow the cool air through the plurality of heat radiating fins of the finned heat sink to remove substantially all of the heat generated by the electronic heat generating circuitry via convection and generate heated air, and wherein the heated air is exhausted through the heated air exhaust portal by the fan, and wherein an active cooling path comprises a path of air as it is received from the cool air intake port, passes through the fan, over each of the plurality of heated surfaces, and then is exhausted from the heated air exhaust port, and further wherein, the heated air exhaust port comprises— one or more holes in the faceplate formed at a first acute angle β with respect to an imaginary line perpendicular to a surface of the faceplate such that the heated air is expelled away from the faceplate in a first direction, and the cool air intake port comprises— one or more holes in the faceplate formed at a second acute angle α with respect to an imaginary line perpendicular to the surface of the faceplate such that the cool air is ingested into the substantially adiabatic enclosure from a second direction, and wherein the first and second acute angles are in opposition to each other, and further wherein the heated air exhaust port is separated with respect to the cool air intake port; and a first passive cooling path comprising:

the electronic heat generating circuitry;

the printed circuit board upon which the electronic heat generating circuitry is located;

one or more through hole thermal vias located in the printed circuit board that are each adapted to be in thermal contact with the electronic heat generating circuitry and to accept heat generated by the electronic heat generating circuitry and transfer the heat generated by the electronic heat generating circuitry;

a first heat conducting device adapted to be in thermal contact with the one or more through hole thermal vias, and which is adapted to transfer heat via conduction from the one or more through hole vias, and which is further adapted to be a compressible gap pad to form a thermal transfer path between two objects;

a second heat conducting device adapted to be in thermal contact with the first heat conducting device and to accept heat conducted by the first heat conducting device; and a third heat conducting device adopted to be in thermal contact with the second heat conducting device and to accept heat conducted from the first heat conducting device and is further adapted to be a compressible gap pad to form a thermal transfer path between two objects, and wherein the face plate is adapted to be in thermal contact with the third heat conducting device and to accept heat conducted from the second heat conducting device, and is further adapted to transfer received heat from its surface to the surrounding air via convection and radiation.

* * * * *